United States Patent
Nirengi et al.

(10) Patent No.: US 9,577,210 B2
(45) Date of Patent: Feb. 21, 2017

(54) METHOD FOR PRODUCING TOP-EMISSION ORGANIC ELECTROLUMINESCENCE DISPLAY DEVICE AND COVER MATERIAL FOR FORMING TOP-EMISSION ORGANIC ELECTROLUMINESCENCE DISPLAY DEVICE

(71) Applicant: DAI NIPPON PRINTING CO., LTD., Tokyo-to (JP)

(72) Inventors: Takayoshi Nirengi, Tokyo-to (JP); Toshihiko Takeda, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/914,217

(22) PCT Filed: Aug. 28, 2014

(86) PCT No.: PCT/JP2014/072598
§ 371 (c)(1),
(2) Date: Feb. 24, 2016

(87) PCT Pub. No.: WO2015/030123
PCT Pub. Date: Mar. 5, 2015

(65) Prior Publication Data
US 2016/0204389 A1    Jul. 14, 2016

(30) Foreign Application Priority Data

Aug. 30, 2013 (JP) ................................. 2013-179677
Aug. 27, 2014 (JP) ................................. 2014-172895

(51) Int. Cl.
*H01L 51/56* (2006.01)
*H01L 51/00* (2006.01)
*H01L 51/52* (2006.01)

(52) U.S. Cl.
CPC ....... *H01L 51/5228* (2013.01); *H01L 51/0023* (2013.01); *H01L 51/0043* (2013.01);
(Continued)

(58) Field of Classification Search
CPC ............ H01L 51/5228; H01L 51/0043; H01L 51/5234; H01L 51/5253; H01L 51/0023; H01L 51/5212
See application file for complete search history.

(56) References Cited

U.S. PATENT DOCUMENTS

2004/0253756 A1    12/2004  Cok et al.
2008/0287028 A1    11/2008  Ozawa
(Continued)

FOREIGN PATENT DOCUMENTS

JP    2002-324667 A    11/2002
JP    2008-288074 A    11/2008
(Continued)

OTHER PUBLICATIONS

Oct. 28, 2014 Search Report issued in International Patent Application No. PCT/JP2014/072598.
(Continued)

*Primary Examiner* — Joseph L Williams
(74) *Attorney, Agent, or Firm* — Oliff PLC

(57) ABSTRACT

A method for producing top-emission organic EL display device, in which, using cover material having flexibility such as resin film, space between organic EL layer-side substrate and cover material is made into decompressed state, thereafter, adhesion properties between organic EL layer-side substrate and cover material is maintained by retaining decompressed state in the space between organic EL layer-side substrate and cover material when adhering organic EL layer-side substrate and cover material by adjusting pressure of space on opposite side to the organic EL layer-side substrate, in relation to cover material so that deterioration in display properties can be restrained by preventing organic layer on auxiliary electrode removed by laser light from being scattered on pixel area. In the method for producing top-emission organic EL display device described above, resin film including barrier property with (Continued)

oxygen permeability of 100 cc/m2·day or less is used as the cover material.

7 Claims, 8 Drawing Sheets

(52) U.S. Cl.
CPC ...... *H01L 51/5212* (2013.01); *H01L 51/5234* (2013.01); *H01L 51/5253* (2013.01); *H01L 51/56* (2013.01); *H01L 2251/5315* (2013.01)

(56) References Cited

U.S. PATENT DOCUMENTS

| | | |
|---|---|---|
| 2009/0061724 A1 | 3/2009 | Cok et al. |
| 2009/0279285 A1 | 11/2009 | Nakayama et al. |
| 2012/0318447 A1 | 12/2012 | Ozawa |

FOREIGN PATENT DOCUMENTS

| | | |
|---|---|---|
| JP | 2010-538440 A | 12/2010 |
| JP | 2012-028226 A | 2/2012 |
| JP | 2012-028638 A | 2/2012 |
| JP | 2012-079419 A | 4/2012 |
| JP | 4959119 B2 | 6/2012 |
| WO | 2007/049470 A1 | 5/2007 |
| WO | 2012/081625 A1 | 6/2012 |

OTHER PUBLICATIONS

Aug. 4, 2005 Amendment to Japanese Patent Application No. 2002-324667.

METHOD FOR PRODUCING TOP-EMISSION ORGANIC ELECTROLUMINESCENCE DISPLAY DEVICE AND COVER MATERIAL FOR FORMING TOP-EMISSION ORGANIC ELECTROLUMINESCENCE DISPLAY DEVICE

TECHNICAL FIELD

The present disclosure relates to a method for producing a top-emission organic electroluminescence display device including an auxiliary electrode.

BACKGROUND ART

Organic electroluminescence elements have drawn attention in terms of advantages such as high visibility by self-coloring, excellent impact resistance for being an entirely solid display unlike a liquid crystal display device, a fast response rate, small influence by a change in temperature, and a wide viewing angle. Incidentally, hereinafter, in some cases, an organic electroluminescence is abbreviated to organic EL.

The configuration of the organic EL element is based on a laminated structure where an organic EL layer is interposed between an anode and a cathode. As a driving method for the organic EL display device including the organic EL element, there are passive matrix driving and active matrix driving, but the active matrix driving is useful in terms that the active matrix driving can be performed at a low voltage in production of a large-sized display. Incidentally, the active matrix driving denotes a method of driving the organic EL display device by forming a circuit such as TFT on a substrate where the organic EL element is formed and driving the organic EL display device by the circuit such as TFTs.

As the organic EL display device, there are a bottom emission type in which light is emitted from a substrate side where the organic EL element is formed and a top emission type in which light is emitted from a side opposite to the substrate where the organic EL element is formed. Here, in the case of the active matrix driving organic EL display device, in the bottom emission type, there is a problem in that an aperture ratio is limited by the circuit such as TFT formed on the substrate, which is a light emitting surface, and a light emitting efficiency is deteriorated. In contrast, in the top emission type, since light is emitted from the surface of the side opposite to the substrate, an excellent light emitting efficiency can be obtained in comparison with the bottom emission type. Incidentally, in the case of the top emission type, a transparent electrode layer is used as an electrode layer of the side which becomes the light emitting surface.

A general transparent electrode layer has high resistance in comparison with an electrode layer comprising a metal such as Al or Cu. For this reason, in the organic EL display device including the transparent electrode layer, voltage drop occurs due to the resistance of the transparent electrode layer, and as a result, uniformity of brightness of the organic EL layer is deteriorated, so that a problem of so-called brightness irregularity occurs. In addition, as an area of the transparent electrode layer is increased, the resistance is increased, and thus, the above-described problem of brightness irregularity becomes remarkable in the case of producing a large-sized display.

With respect to the above-described problem, there is known a method of suppressing voltage drop by forming auxiliary electrodes having a low resistance value and electrically connecting the auxiliary electrodes to the transparent electrode layer. Here, the auxiliary electrodes are generally formed in a pattern shape by applying an etching process by a wet process after formation of a metal layer. For this reason, in the top-emission organic EL display device, in the case where the auxiliary electrodes are formed after formation of the organic EL layer, there is a problem in that an etchant used for forming the auxiliary electrode is infiltrated into the organic EL layer. Therefore, as disclosed in Patent Documents 1 to 3, there is known a method of forming the auxiliary electrodes before formation of the organic EL layer.

However, if the auxiliary electrodes are formed before formation of the organic EL layer, in the case where the organic EL layer is to be formed on the entire surface or in the case where at least one layer of the organic layers constituting the organic EL layer is formed on the entire surface, the organic EL layer or the at least one of the organic layers is formed on the auxiliary electrodes. For this reason, there is a problem in that electrically connection between the auxiliary electrodes and the transparent electrode layer may be prevented by the organic EL layer or the organic layer on the auxiliary electrodes.

Therefore, in Patent Documents 1, there is proposed a method of producing the organic EL display device where the organic EL layer on the auxiliary electrodes is removed by a laser light and the auxiliary electrode and the transparent electrode layer are electrically connected to each other. However, in this case, the organic EL layer removed by the laser light is scattered, and thus, pixel areas of the organic EL display device are contaminated, so that there is a problem in that display properties are deteriorated.

In addition, as a method of solving the above-described problem, for example, in Patent Document 2, there is proposed a method of forming a first electrode having light transmittance on the entire surfaces of the auxiliary electrodes covered with the organic EL layer before removing the organic EL layer by a laser light, after that, removing the organic EL layer by the laser light through the first electrode, and finally, forming a second electrode. However, in this case, although the above-described deterioration in display properties can be suppressed, since the first electrode and the second electrode are formed as the transparent electrode layers, there is a problem in that the number of production processes is increased.

CITATION LIST

Patent Documents

Patent Document 1: Japanese Patent No. 4959119
Patent Document 2: Japanese Translation of PCT International Application Publication No. JP-T-2010-538440
Patent Document 3: Japanese Patent No. 4340982

SUMMARY

Technical Problem

Patent Document 3 discloses a production method for an organic EL display device as a method of preventing the organic layers removed by the laser light from contaminating the display device, as follows. Namely, as illustrated in FIG. 12A, pixel electrodes 30 and an auxiliary electrode 40 are formed on a substrate 20, and a partition 50 is formed between the pixel electrodes 30 and the auxiliary electrode 40, and after that, as illustrated in FIG. 12B, an organic EL layer 60 is formed, so that an organic EL layer side substrate 100' is formed. Next, as illustrated in FIG. 12C, under a reduced pressure, a cover material 80 made of a glass substrate or a resin film is allowed to face the organic EL layer side substrate 100', so that the cover material 80 is arranged so as to be in contact with top portions of the partition 50, and a space V between the organic EL layer side substrate 100' and the cover material 80 is set to be in a reduced pressure state. After that, by pressuring an outer peripheral space of the organic EL layer side substrate 100' and the cover material 80, the cover material 80 is allowed to be adhered to the organic EL layer side substrate 100'. Next, the organic EL layer 60 on the auxiliary electrode 40 is removed by a laser light L, and as illustrated in FIG. 12D, the cover material 80 is peeled off. Finally, as illustrated in FIG. 12E, a transparent electrode layer 70 is formed on the organic EL layer side substrate, so that an organic EL display device 100, in which the auxiliary electrode 40 and the transparent electrode layer 70 are electrically connected to each other, is formed. Incidentally, the problem is that the use of the cover material made of a glass substrate in producing the organic EL display device by the method described above makes difficult to develop the production into a roll-to-roll manufacturing technique. Thus, it is conceived that the use of the cover material having flexibility such as a resin film is advantageous from the viewpoint of improving production efficiency.

Thus, the inventors of an embodiment of the present invention have studied a method such that a space between an organic EL layer-side substrate and a cover material is made into a decompressed state by contacting the organic EL layer-side substrate and the cover material under reduced pressure with the use of the cover material having flexibility such as a resin film; subsequently, the organic EL layer-side substrate and the cover material are adhered by pressurizing an outer peripheral space of the organic EL layer-side substrate and the cover material; thereafter, an organic layer on the auxiliary electrode is removed by illuminating with laser light through the cover material. As a result, the inventors of the present disclosure have found the following new problem. That is to say, it was understood that when a space between the organic EL layer-side substrate and the cover material is made into a decompressed state by contacting the cover material made of a resin film with the organic EL layer-side substrate under reduced pressure to thereafter pressurize an outer peripheral space of the organic EL layer-side substrate and the cover material, degree of vacuum in the space between the organic EL layer-side substrate and the cover material deteriorates with time. The reason therefore is conceived to be that gas intrudes from the outer peripheral space of the organic EL layer-side substrate and the cover material into the space between the organic EL layer-side substrate and the cover material. Also, the space between the organic EL layer-side substrate and the cover material is so narrow that only a slight intrusion of gas deteriorates the degree of vacuum remarkably. Here, adhesion properties between the organic EL layer-side substrate and the cover material increases as a difference between pressure of the space between the organic EL layer-side substrate and the cover material and pressure of the outer peripheral space of the organic EL layer-side substrate and the cover material increases. Accordingly, when the degree of vacuum in the space between the organic EL layer-side substrate and the cover material deteriorates, the difference between pressure of the space between the organic EL layer-side substrate and the cover material and pressure of the outer peripheral space of the organic EL layer-side substrate and the cover material decreases, and adhesion properties between the organic EL layer-side substrate and the cover material weakens. As a result, the problem is that adhesion properties on a contact face between the organic EL layer-side substrate and the cover material may not be maintained in removing an organic layer by laser light, and it becomes difficult to sufficiently prevent the organic layer removed by laser light from being scattered on a pixel area.

The present disclosure has been made in view of the actual circumstances, and a main object thereof is to provide a method for producing a top-emission organic EL display device, in which, using a cover material having flexibility such as a resin film, a space between an organic EL layer-side substrate and a cover material is made into a decompressed state, thereafter, adhesion properties between the organic EL layer-side substrate and the cover material is maintained by retaining the decompressed state in the space between the organic EL layer-side substrate and the cover material when adhering the organic EL layer-side substrate and the cover material by adjusting pressure of a space on the opposite side to the organic EL layer-side substrate, in relation to the cover material so that the deterioration in display properties can be restrained by preventing an organic layer on an auxiliary electrode removed by laser light from being scattered on a pixel area.

Solution to Problem

To achieve the above object, an embodiment of the present invention provides a method for producing a top-emission organic EL display device, the top-emission organic EL display device comprising: a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer being electrically connected to the auxiliary electrode in the contact portion; and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode, an arrangement step of arranging a cover material to face the organic EL layer-side substrate obtained in the organic EL layer-side substrate preparing step under a first pressure so that the cover material is in contact with a top portion of the spacer portion by the intermediary of the organic layers, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layer formed on the auxiliary electrode by illuminating with laser light through the cover material;

wherein the cover material is a resin film including a barrier property with an oxygen permeability of 100 cc/m²·day or less.

According to an embodiment of the present invention, the cover material used in the arrangement step is a resin film including a barrier property with an oxygen permeability of 100 cc/m²·day or less, so that a decompressed state in a space between the organic EL layer-side substrate and the cover material can be retained. Thus, in the contact portion forming step, adhesion properties between the organic EL layer-side substrate and the cover material can be maintained also in illuminating the organic layer on the auxiliary electrode with laser light through the cover material, and the organic layer removed by laser light can be sufficiently prevented from being scattered on a pixel area on which the pixel electrode is formed, and a top-emission organic EL display device, in which deterioration in display properties can be restrained, can be obtained. Also, the cover material used in an embodiment of the present invention is a resin film, so that the production efficiency can be improved so that the development into a roll-to-roll manufacturing technique is allowed.

In an embodiment of the present invention, a minimum transmittance value of the cover material in a wavelength range of 340 nm to 400 nm is preferably equal to or greater than 70%. The laser light can be prevented from being absorbed in the cover material when illuminating the organic layer with the laser light through the cover material in the contact portion forming step for the reason that the minimum transmittance value of the cover material in a wavelength range of 340 nm to 400 nm is equal to or greater than 70%, so that the contact portion can be formed while securely removing the organic layer. Thus, the occurrence of brightness unevenness due to voltage drop can be restrained by sufficiently connecting the transparent electrode layer and the auxiliary electrode in the contact portion.

An embodiment of the present invention provides a method for producing an organic EL display device, the top-emission organic EL display device comprising a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer being electrically connected to the auxiliary electrode in the contact portion, and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode, an arrangement step of arranging a cover material to face the organic EL layer-side substrate obtained in the organic EL layer-side substrate preparing step under a first pressure so that the cover material is in contact with a top portion of the spacer portion by the intermediary of the organic layer, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layer formed on the auxiliary electrode by illuminating with laser light through the cover material; wherein the cover material is a polyethylene terephthalate film.

According to an embodiment of the present invention, the cover material used in the arrangement step comprises polyethylene terephthalate, so that a decompressed state in a space between the organic EL layer-side substrate and the cover material can be retained. Thus, in the contact portion forming step, adhesion properties between the organic EL layer-side substrate and the cover material can be maintained also when illuminating the organic layer on the auxiliary electrode with laser light through the cover material, and the organic layer removed by laser light can be sufficiently prevented from being scattered on a pixel area on which the pixel electrode is formed, and the top-emission organic EL display device, in which deterioration in display properties can be restrained, can be obtained. Also, the laser light can be prevented from being absorbed in the cover material when illuminating the organic layer with the laser light through the cover material in the contact portion forming step for the reason that the cover material used in an embodiment of the present invention comprises polyethylene terephthalate, so that the contact portion can be formed while securely removing the organic layer. Thus, the occurrence of brightness unevenness due to voltage drop can be restrained by sufficiently connecting the transparent electrode layer and the auxiliary electrode in the contact portion. In addition, production efficiency can be improved so that the development into a roll-to-roll manufacturing technique is allowed.

In an embodiment of the present invention, the cover material preferably has a barrier layer. The cover material used in an embodiment of the present invention has a barrier layer, so that a decompressed state in a space between the organic EL layer-side substrate and the cover material can be retained more effectively. Thus, in the contact portion forming step, adhesion properties between the organic EL layer-side substrate and the cover material can be sufficiently maintained also when illuminating the organic layer on the auxiliary electrode with laser light through the cover material. Thus, the organic layer removed by laser light can be prevented more securely from being scattered on a pixel area on which the pixel electrode is formed, and the top-emission organic EL display device, in which deterioration in display properties can be restrained, can be obtained.

An embodiment of the present invention provides a method for producing a top-emission organic EL display device, the top-emission organic EL display device comprising a substrate, a plurality of pixel electrodes formed on the substrate, an auxiliary electrode formed between the pixel electrodes adj acent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer is electrically connected to the auxiliary electrode in the contact portion; and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode, an arrangement step of arranging a cover material to face the organic EL layer-side substrate obtained in the organic EL layer-side substrate preparing step under a first pressure so that the cover material is in contact with a top portion of the spacer portion by the intermediary of the organic layer, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layers formed on the auxiliary electrode by illuminating with laser light through the cover material, wherein the cover material is a glass film.

According to an embodiment of the present invention, the cover material used in the arrangement step is a glass film, so that a decompressed state in a space between the organic EL layer-side substrate and the cover material can be retained. Thus, in the contact portion forming step, adhesion properties between the organic EL layer-side substrate and the cover material can be maintained also when illuminating the organic layer on the auxiliary electrode with laser light through the cover material, and the organic layer removed by laser light can be sufficiently prevented from being scattered on a pixel area on which the pixel electrode is formed, and the top-emission organic EL display device, in which deterioration in display properties can be restrained, can be obtained. Also, since the cover material is a glass film, production efficiency can be improved so that the development into a roll-to-roll manufacturing technique is allowed.

An embodiment of the present invention provides a cover material for forming a top-emission organic EL display device used in the above-mentioned method for producing a top-emission organic EL display device, wherein the cover material is a resin film including a barrier property with an oxygen permeability of 100 cc/m$^2$·day or less, and a minimum transmittance value in the wavelength range of 340 nm to 400 nm is equal to or greater than 70%.

An embodiment of the present invention can produce the top-emission organic EL display device by the producing method described above for the reason that the cover material is a resin film including a barrier property with an oxygen permeability of 100 cc/m$^2$·day or less and the minimum transmittance value in a wavelength range of 340 nm to 400 nm is equal to or greater than 70%, and the top-emission organic EL display device, in which deterioration in display properties can be restrained, can be obtained.

Advantageous Effects of Disclosure

An embodiment of the present invention produces the effect such that a decompressed state in a space between the organic EL layer-side substrate and the cover material having flexibility such as a resin film can be retained, and the top-emission organic EL display device, in which deterioration in display properties can be restrained, can be obtained by preventing the organic layer on the auxiliary electrode removed by laser light from being scattered on a pixel area.

DESCRIPTION OF EMBODIMENTS

Figure 1A:
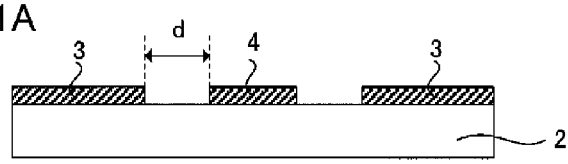
FIGS. 1A to 1F are process drawings showing an example of a method for producing a top-emission organic EL display device of an embodiment of the present invention.
Figure 1B:
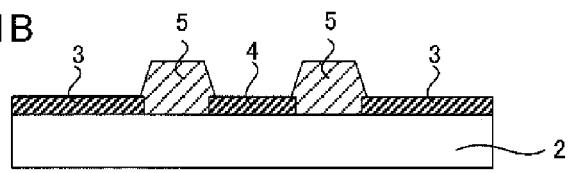
Figure 1C:
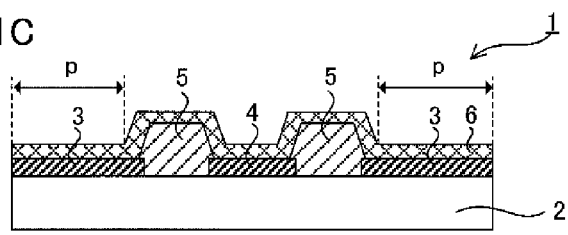
Figure 1D:
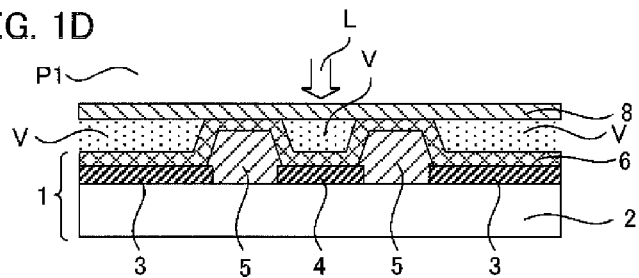

A method for producing a top-emission organic EL display device and a cover material for forming a top-emission organic EL display device of an embodiment of the present invention are hereinafter described in detail. Incidentally, a top-emission organic EL display device is occasionally abbreviated as an organic EL display device hereinafter.

A. Method for Producing Organic EL Display Device

A method for producing an organic EL display device of an embodiment of the present invention has three aspects in accordance with a cover material.

A first aspect of the method for producing an organic EL display device of an embodiment of the present invention is a method for producing an organic EL display device comprising a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer being electrically connected to the auxiliary electrode in the contact portion; and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode, an arrangement step of arranging a cover material to face the organic EL layer-side substrate obtained in the organic EL layer-side substrate preparing step under a first pressure so that the cover material is in contact with the top portion of the spacer portion by the intermediary of the organic layer, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layer formed on the auxiliary electrode by illuminating with laser light through the cover material, wherein the cover material is a resin film including a barrier property with an oxygen permeability of 100 cc/m$^2$·day or less.

A second aspect of the method for producing an organic EL display device of an embodiment of the present invention is a method for producing an organic EL display device, the organic EL display device comprising a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer being electrically connected to the auxiliary electrode in the contact portion; and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers is formed on the whole surface of the auxiliary electrode, an arrangement step of arranging a cover material to face the organic EL layer-side substrate obtained in the organic EL layer-side substrate preparing step under a first pressure so that the cover material is in contact with the top portion of the spacer portion by the intermediary of the organic layer, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layer formed on the auxiliary electrode by illuminating with laser light through the cover material, wherein the cover material is a polyethylene terephthalate film.

A third aspect of the method for producing an organic EL display device of an embodiment of the present invention is a method for producing an organic EL display device, the organic EL display device comprising: a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EZ layer and the contact portion, the spacer portion being formed between the contact portion and the pixel electrode adjacent to the contact portion, and the transparent electrode layer being electrically connected to the auxiliary electrode in the contact portion; and the method for producing a top-emission organic EL display device comprising steps of: an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode, an arrangement step of arranging a cover material to face the organic EL layer-side substrate obtained in the organic EL layer-side substrate preparing step under a first pressure so that the cover material is in contact with the top portion of the spacer portion by the intermediary of the organic layer, an adhering step of adhering the organic EL layer-side substrate and the cover material by adjusting a space on the opposite side to the organic EL layer-side substrate, in relation to the cover material, to a second pressure which is higher than the first pressure, and a contact portion forming step of forming the contact portion by removing the organic layer formed on the auxiliary electrode by illuminating with laser light through the cover material, wherein the cover material is a glass film.

Here, the "first pressure" and the "second pressure" are not particularly limited as long as the first pressure is a lower pressure than the second pressure. Also, they are not particularly limited as long as they are pressures such as to allow the organic EL layer-side substrate and the cover material to be adhered by differential pressure between pressure of a space between the organic EL layer-side substrate and the cover material and pressure of a space on the opposite side to the organic EL layer-side substrate, in relation to the cover material, when adjusting the pressure of a space between the organic EL layer-side substrate and the cover material to the first pressure and the pressure of a space on the opposite side to the organic EL layer-side substrate, in relation to the cover material, to the second pressure when arranging the cover material on the surface of the organic EL layer-side substrate. Incidentally, ordinarily, the "first pressure" is a lower pressure than normal pressure and the "second pressure" is a higher pressure than the "first pressure". Also, the specific "first pressure" and "second pressure" are described in the after-mentioned items of "2. Arrangement step" and "3. Adhering step"; therefore, the description herein is omitted.

Figure 1E:
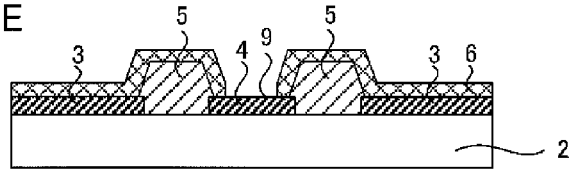
Figure 1F:
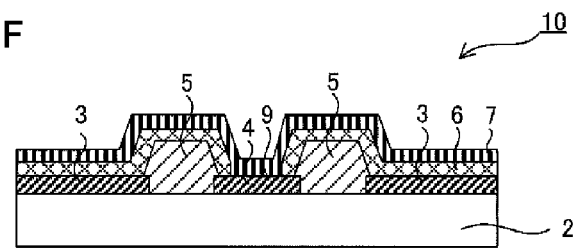

FIGS. 1A to 1F are a process drawing showing an example of the method for producing an organic EL display device of an embodiment of the present invention. First, as exemplified in FIG. 1A, a pixel electrode and auxiliary electrode forming step of forming a pixel electrode 3 and an auxiliary electrode 4 on a substrate 2 is performed. Next, as exemplified in FIG. 1B, a spacer portion forming step of forming a spacer portion 5 on the substrate 2 is performed. Thereafter, as exemplified in FIG. 1C, an organic EL layer forming step of forming an organic EL layer 6 comprising a plurality of organic layers and including at least a luminous layer is performed. In this manner, an organic EL layer-side substrate preparing step of preparing an organic EL layer-side substrate 1 is performed. Subsequently, as exemplified in FIG. 1D, an arrangement step of arranging a cover material 8 which is a resin film having a predetermined oxygen permeability, a cover material 8 which is a polyethylene terephthalate film, or a cover material 8 which is a glass film to face the organic EL layer-side substrate 1 under a first pressure so that the cover material 8 is in contact with the top portion of the spacer portion 5 by the intermediary of the organic EL layer 6 is performed. On this occasion, a space V between the organic EL layer-side substrate 1 and the cover material 8 is made into a decompressed state. Thereafter, an adhering step of adhering the organic EL layer-side substrate and the cover material by adjusting a space P1 on the opposite side to the organic EL layer-side substrate 1, in relation to the cover material 8, to a second pressure which is higher than the first pressure, is performed. Next, a contact portion forming step of removing the organic EL layer 6 on the auxiliary electrode 4 by illuminating the organic EL layer 6 formed on the auxiliary electrode 4 with laser light L through the cover material B to form the contact portion 9 by exposing the auxiliary electrode 4 as exemplified in FIG. 1E is performed. Lastly, as exemplified in FIG. 1F, a transparent electrode layer forming step of forming a transparent electrode layer 7 on the organic EL layer-side substrate so as to be electrically connected to the auxiliary electrode 4 in the contact portion 9 is performed. Thus, an organic EL display device 10 in an embodiment of the present invention is obtained.

Figure 2A:
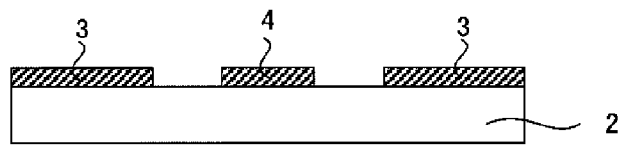
FIGS. 2A to 2F are process drawings showing another example of a method for producing a top-emission organic EL display device of an embodiment of the present invention.
Figure 2B:
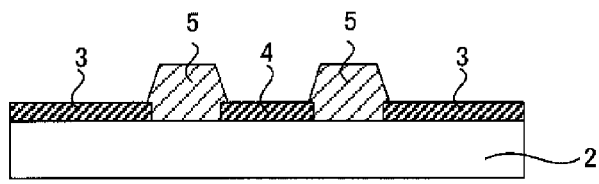
Figure 2C:
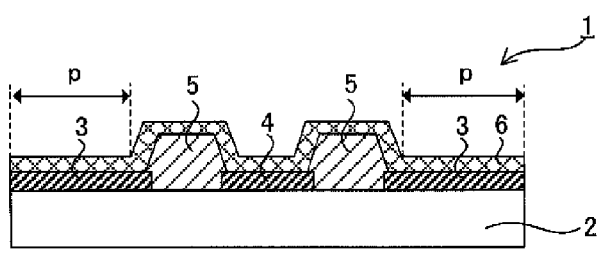
Figure 2D:
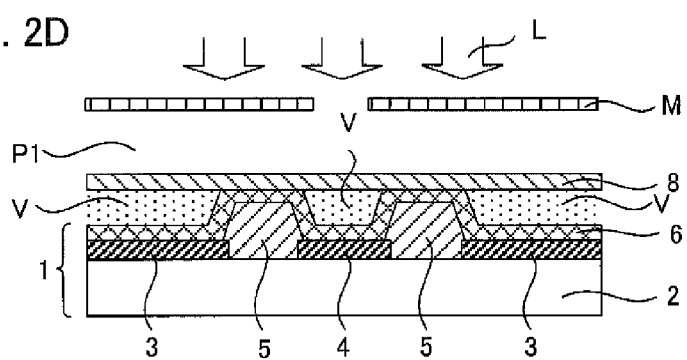
Figure 2E:
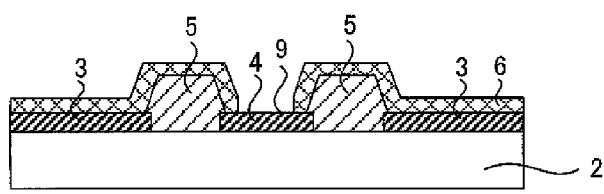
Figure 2F:
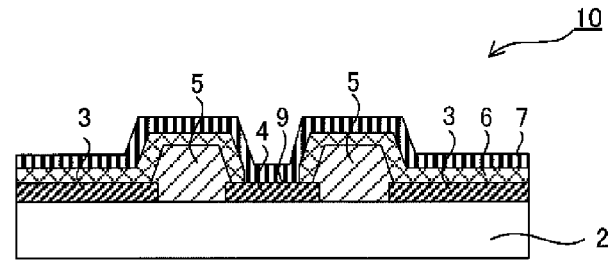
Figure 3:
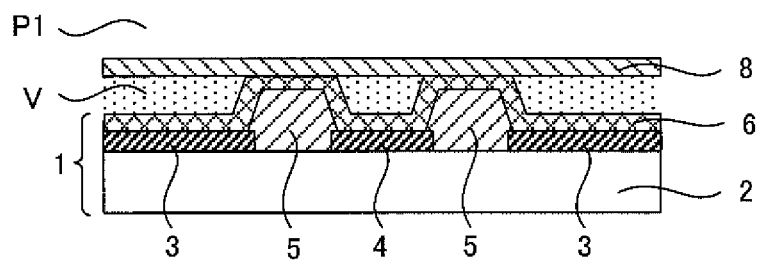
FIG. 3 is a schematic view explaining a method for producing a top-emission organic EL display device of an embodiment of the present invention.

FIGS. 2A to 2F are a process drawing showing another example of the method for producing an organic EL display device of an embodiment of the present invention. Incidentally, since FIGS. 2A to 2C are the same as FIGS. 1A to 10 described above, the description is omitted. Next, as exemplified in FIG. 2D, an arrangement step of arranging a cover material 8 satisfying predetermined conditions to face the organic EL layer-side substrate 1 under a first pressure so that the top portion of the spacer portion 5 and the cover material 8 is in contact by the intermediary of the organic EL layer 6 is performed. On this occasion, a space V between the organic EL layer-side substrate 1 and the cover material 8 is made into a decompressed state. Thereafter, an adhering step of adjusting a space P1 on the opposite side to the organic EL layer-side substrate 1, in relation to the cover material 8, to a second pressure which is higher than the first pressure to adhere the organic EL layer-side substrate 1 and the cover material 8 is performed. Subsequently, a contact portion forming step of removing the organic EL layer 6 formed on the auxiliary electrode 4 by illuminating with laser light L from the cover material B side through a mask M including an opening in a region in which the auxiliary electrode 4 is formed to form the contact portion 9 by exposing the auxiliary electrode 4 as exemplified in FIG. 2E is performed. Lastly, as exemplified in FIG. 2F, a transparent electrode layer forming step of forming a transparent electrode layer 7 on the organic EL layer-side substrate so as to be electrically connected to the auxiliary electrode 4 in the contact portion 9 is performed. Thus, an organic EL display device 10 in an embodiment of the present invention is obtained.

Thus, in an embodiment of the present invention, the cover material used in the arrangement step is a resin film having predetermined oxygen permeability, a polyethylene terephthalate film, or a glass film, so that a decompressed state in a space between the organic EL layer-side substrate and the cover material can be retained. Thus, in the contact portion forming step, adhesion properties between the organic EL layer-side substrate and the cover material can be maintained also when illuminating the organic layer on the auxiliary electrode with laser light through the cover material, and the organic layer removed by laser light can be sufficiently prevented from being scattered on a pixel area on which the pixel electrode is formed. Thus, the organic EL display device, in which deterioration in display properties can be restrained, can be obtained.

Figure 4:
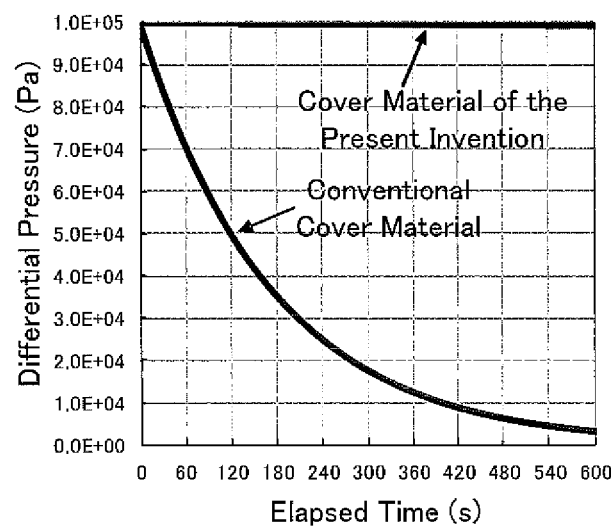
FIG. 4 is a graph showing gas permeability of a cover material.

The reason therefore is conceived to be as follows. First, as exemplified in FIG. 3, adhesion properties between the organic EL layer-side substrate 1 and the cover material 8 increases as a difference between pressure of a space P1 on the opposite side to the organic EL layer-side substrate 1, in relation to the cover material 8, and pressure of a space V between the organic EL layer-side substrate 1 and the cover material 8, that is, differential pressure increases. Thus, the organic EL layer-side substrate 1 and the cover material 8 are contacted under a first pressure, and thereafter pressure of a space V between the organic EL layer-side substrate 1 and the cover material 8 is made lower than pressure of a space P1 on the opposite side to the organic EL layer-side substrate 1, in relation to the cover material 8, by adjusting a space P1 on the opposite side to the organic EL layer-side substrate 1, in relation to the cover material 8, to a second pressure which is higher than the first pressure, and adhesion properties between the organic EL layer-side substrate 1 and the cover material 8 increases by increasing differential pressure between a space P1 on the opposite side to the organic EL layer-side substrate 1, in relation to the cover material 8, and a space V between the organic EL layer-side substrate 1 and the cover material 8. However, in a conventional method using a general cover material made of a resin film, as shown in the graph of FIG. 4, differential pressure between a space on the opposite side to the organic EL layer-side substrate, in relation to the cover material, and a space between the organic EL layer-side substrate and the cover material decreases with time. Specifically, in the case of a conventional cover material, differential pressure decreases by 50% in two minutes and the differential pressure dissolves in ten minutes. The reason therefore is conceived to be that the barrier property of the cover material, used in a conventional method, against gas is so low that gas intrudes from the outer peripheral of the organic EL layer-side substrate and the cover material into the space between the organic EL layer-side substrate and the cover material. Incidentally, it is conceived that the space between the organic EL layer-side substrate and the cover material is so narrow that only a slight intrusion of gas deteriorates the degree of vacuum remarkably and differential pressure between a space on the opposite side to the organic EL layer-side substrate, in relation to the cover material, and a space between the organic EL layer-side substrate and the cover material decreases. On the other hand, in an embodiment of the present invention using a cover material satisfying predetermined conditions, as shown in the graph of FIG. 4, differential pressure between a space on the opposite side to the organic EL layer-side substrate, in relation to the cover material, and a space between the organic EL layer-side substrate and the cover material can be maintained. The reason therefore is conceived to be that the cover material used in an embodiment of the present invention has a predetermined barrier property against gas, so that gas can be prevented from intruding from the outer peripheral space of the organic EL layer-side substrate and the cover material into the space between the organic EL layer-side substrate and the cover material. Accordingly, in an embodiment of the present invention, it is surmised that a decompressed state in a space between the organic EL layer-side substrate and the cover material can be retained, and in the contact portion forming step, adhesion properties between the organic EL layer-side substrate and the cover material can be maintained also when illuminating the organic layer on the auxiliary electrode with laser light through the cover material.

In addition, the cover material used in an embodiment of the present invention is a resin film, a polyethylene terephthalate film or a glass film, so that the development into a roll-to-roll manufacturing technique is allowed. Thus, production efficiency of an organic EL display device can be improved.

Also, in the case where the cover material used in an embodiment of the present invention is a resin film or a polyethylene terephthalate film, cracking can be prevented and the handling is facilitated.

Figure 10:
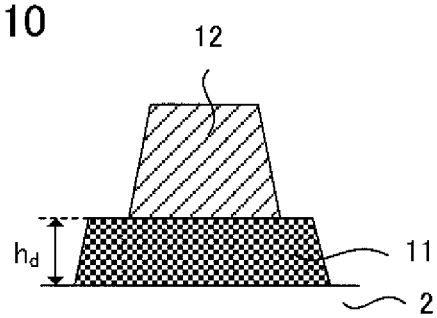
FIG. 10 is a schematic view explaining a spacer portion in an embodiment of the present invention.

Here, "at least one layer of the organic layers is formed on the whole surface of the auxiliary electrode" in an embodiment of the present invention, as exemplified in FIG. 10 and FIG. 2C, includes, for example, an aspect such that all layers composing the organic EL layer 6 are formed on the whole surface so as to cover the inside of a pixel area p, on which the pixel electrode 3 is formed, and the auxiliary electrode 4; additionally, in the case where the organic EL layer is provisionally comprising four layers of a hole injecting layer, a hole transporting layer, a luminous layer and an electron injecting layer, an aspect such that three layers of the four layers are formed in the pixel area in a pattern and the other layer is formed on the whole surface so as to cover the inside of the pixel area and the auxiliary electrode, an aspect such that two layers of the four layers are formed in the pixel area in a pattern and the other two layers are formed on the whole surface so as to cover the inside of the pixel area and the auxiliary electrode, and an aspect such that one layer of the four layers is formed in the pixel area in a pattern and the other three layers are formed on the whole surface so as to cover the inside of the pixel area and the auxiliary electrode.

Figure 5:
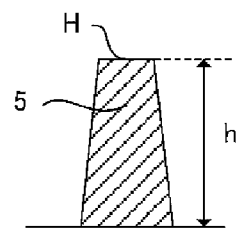
FIG. 5 is a schematic view explaining a spacer portion in an embodiment of the present invention.

Also, "the top portion of the spacer portion" in an embodiment of the present invention, as exemplified in FIG. 5, signifies an upper base surface H of the spacer portion 5 in the case where the spacer portion 5 is a trapezoid. Also, in the case where the spacer portion is a shape except a trapezoid, it signifies the most top portion of the spacer portion, and a portion where the cover material contacts first in the spacer portion on the occasion of contacting the organic EL layer-side substrate and the cover material.

Each step in the method for producing an organic EL display device of an embodiment of the present invention is hereinafter described.

1. Organic EL Layer-Side Substrate Preparing Step

In an embodiment of the present invention, first, in a method for producing an organic EL display device comprising: a substrate, a plurality of pixel electrodes formed on the substrate, an auxiliary electrode formed between the pixel electrodes adjacent to each other, a spacer portion formed on the substrate, an organic EL layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic EL layer and the contact portion, the spacer portion being formed between the contact portion and the pixel electrode adjacent to the contact portion, and the transparent electrode layer is electrically connected to the auxiliary electrode in the contact portion; an organic EL layer-side substrate preparing step of preparing an organic EL layer-side substrate comprising the substrate, the pixel electrodes, the auxiliary electrode, the spacer portion, and the organic EL layer, at least one layer of the organic layers being formed on the whole surface of the auxiliary electrode is performed.

The forming step of each member formed in this step is hereinafter described.

(1) Pixel Electrode and Auxiliary Electrode Forming Step

This step is a step of forming a pixel electrode and an auxiliary electrode on a substrate.

Each member used in this step and the specific pixel electrode and auxiliary electrode forming step are hereinafter described.

(a) Substrate

A substrate in this step supports the after-mentioned pixel electrode, auxiliary electrode, spacer portion, organic EL layer and transparent electrode layer.

An organic EL display device produced in an embodiment of the present invention is of a top-emission type, so that the substrate may have light transmittance or not. In the case where the substrate has light transmittance and is a transparent substrate, an organic EL display device of a double-face emitting type can be obtained.

Also, the substrate may have flexibility or not, which is properly selected in accordance with uses of the organic EL display device. Examples of a material for such a substrate include glass and resin. Incidentally, a gas barrier layer may be formed on the surface of the substrate.

The thickness of the substrate is properly selected in accordance with materials of the substrate and uses of the organic EL display device, specifically, approximately 0.005 mm to 5 mm.

(b) Pixel Electrode

A pixel electrode in this step is formed on the substrate in a pattern by plurality.

The pixel electrode may have light transmittance or not, but ordinarily does not have light transmittance for the reason that an organic EL display device produced by an embodiment of the present invention is of a top-emission type and the light is taken out from the transparent electrode layer side. Also, in the case where the pixel electrode has light transmittance and is a transparent electrode, an organic EL display device of a double-face emitting type can be obtained.

The pixel electrode may be either of an anode and a cathode.

In the case where the pixel electrode is an anode, resistance is preferably small and a metallic material which is a conductive material is generally used, but an organic compound or an inorganic compound may be used.

A conductive material with a large work function is preferably used for an anode so that a positive hole is easily injected. Examples thereof include metals such as Au, Cr and Mo; inorganic oxides such as indium tin oxide (ITO), indium zinc oxide (IZO), zinc oxide and indium oxide; and conductive polymers such as metal-doped polythiophene. These conductive materials may be used singly or in combination of two kinds or more. In the case of using two kinds or more, layers composed of each material may be laminated.

Also, in the case where the pixel electrode is a cathode, a metallic material which is a conductive material is generally used, but an organic compound or an inorganic compound may be used.

A conductive material with a small work function is preferably used for a cathode so that an electron is easily injected. Examples thereof include magnesium alloys such as MgAg; aluminum alloys such as AlLi, AlCa and AlMg; and alloys of alkali metals and alkali-earth metals such as Li, Cs, Ba, Sr and Ca.

The thickness of the pixel electrode is properly adjusted in accordance with, for example, the presence or absence of leak current from an edge portion of the pixel electrode, and is, for example, approximately 10 nm to 1000 nm, preferably approximately 20 nm to 500 nm. Incidentally, the thickness of the pixel electrode may be the same as or different from the thickness of the after-mentioned auxiliary electrode.

Incidentally, in the case of forming the pixel electrode all together with the after-mentioned auxiliary electrode, the thickness of the pixel electrode and the auxiliary electrode is equalized.

(c) Auxiliary Electrode

An auxiliary electrode in this step is formed between the pixel electrodes adjacent to each other.

The auxiliary electrode may have light transmittance or not.

A metallic material which is a conductive material is generally used for the auxiliary electrode. Incidentally, a material used for the auxiliary electrode is the same as the material used for the pixel electrode. Therefore, the description herein is omitted.

Also, the material used for the auxiliary electrode may be the same as or different from the material used for the pixel electrode. Above all, the pixel electrode and the auxiliary electrode are preferably of the same material. The reason therefore is to allow the pixel electrode and the auxiliary electrode to be formed all together and allow the production processes to be simplified.

The thickness of the auxiliary electrode is properly adjusted in accordance with, for example, the presence or absence of leak current from an edge portion of the auxiliary electrode, and is preferably, for example, within a range of 10 nm to 1000 nm, more preferably within a range of 20 nm to 500 nm. Incidentally, in the case of forming the auxiliary electrode all together with the pixel electrode described above, the thickness of the pixel electrode and the auxiliary electrode is equalized.

The shape when observing such an auxiliary electrode in the thickness direction thereof, that is, a planar shape is not particularly limited as long as the shape is a shape such as to allow the function of the auxiliary electrode, which restrains voltage drop due to the resistance of the transparent electrode layer, to be performed, but the shape is preferably a shape such as not to deteriorate the takeoff efficiency of light of an organic EL display device. Examples thereof include a stripe shape and a lattice shape.

(d) Pixel Electrode and Auxiliary Electrode

A clearance between the adjacent pixel electrode and auxiliary electrode is not particularly limited as long as the clearance is such as to allow the after-mentioned spacer portion to be formed. Specifically, the clearance is preferably within a range of 1 μm to 50 μm, more preferably within a range of 2 μm to 30 μm. Incidentally, the clearance between the adjacent pixel electrode and auxiliary electrode signifies a distance d shown in FIG. 1A.

(e) Pixel Electrode and Auxiliary Electrode Forming Step

The pixel electrode and auxiliary electrode forming step in an embodiment of the present invention has a step of forming the pixel electrode on the substrate first. A method for forming the pixel electrode is not particularly limited as long as the method is a method such as to allow the pixel electrode to be formed on the substrate in a pattern, but a general method for forming an electrode may be adopted. Examples thereof include an evaporation method using a mask and a photolithography method. Also, examples of the evaporation method include a sputtering method and a vacuum deposition method.

Next, this step has a step of forming the auxiliary electrode between the pixel electrodes adjacent to each other. A method for forming the auxiliary electrode is not particularly limited as long as the method is a method such as to allow the auxiliary electrode to be formed on the substrate in a pattern, but a general method for forming an electrode may be adopted. The specific method for forming the auxiliary electrode is the same as the method for forming the pixel electrode. Therefore, the description herein is omitted. Incidentally, in this step, the auxiliary electrode is preferably formed all together with the pixel electrode. The reason therefore is to allow the production processes to be simplified.

(2) Spacer Portion Forming Step

This step is a step of forming a spacer portion on the substrate.

The spacer portion formed in this step and the specific spacer portion forming step are hereinafter described.

(a) Spacer Portion

The spacer portion formed in this step is formed between the pixel electrode and the after-mentioned contact portion, and has the function of the spacer portion to prevent the organic layer removed by laser light from being scattered in the after-mentioned contact portion forming step. Also, when the spacer portion is in contact with the pixel electrode, the spacer portion has the function as an insulating layer.

Figure 6A:
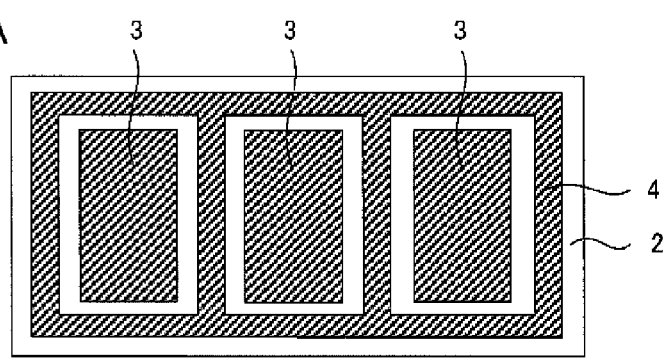
FIGS. 6A to 6C are schematic views showing an example of a spacer portion forming step and an insulating layer forming step in an embodiment of the present invention.
Figure 6B:
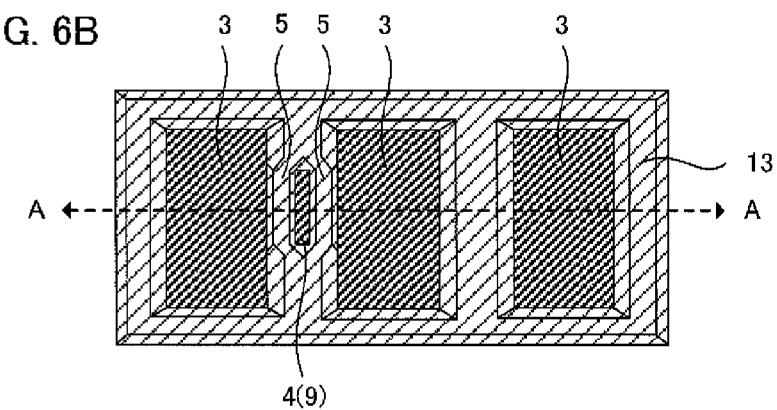
Figure 6C:
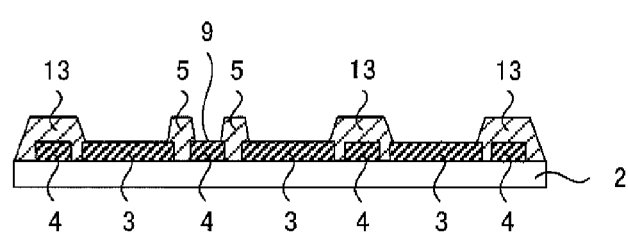

Incidentally, in the case where the spacer portion has the function as an insulating layer, an insulating layer forming step of forming the insulating layer is simultaneously performed together with this step of forming the spacer portion, and the spacer portion and the insulating layer may be formed all together. The formation of the spacer portion and the insulating layer all together allows the production efficiency to be improved. FIGS. 6A and 6B are a schematic process drawing showing an example of the case of performing the insulating layer forming step simultaneously with this step to form the spacer portion and the insulating layer all together, and FIG. 6C is an A-A line cross-sectional view of FIG. 6B. First, as exemplified in FIG. 6A, the pixel electrode 3 and the frame-like auxiliary electrode 4 are formed on the substrate 2. Next, as exemplified in FIGS. 6B and 6C, the spacer portion 5 and the insulating layer 13 are formed all together so that the top of the pixel electrode 3 and the upper part of the auxiliary electrode 4 forming the contact portion 9 are exposed. In the case where the spacer portion and the insulating layer are formed all together, the spacer portion and the insulating layer comprise the same material, and the spacer portion 5 and the insulating layer 13 may be successively formed as exemplified in FIG. 6B.

In this step, the number of the spacer portions formed between the pixel electrode and the after-mentioned contact portion is not particularly limited as long as the function described above of the spacer portion can be sufficiently performed by separating the pixel area, on which the pixel electrode is formed, and the contact portion, but the number may be one, or two or more.

Figure 7A:
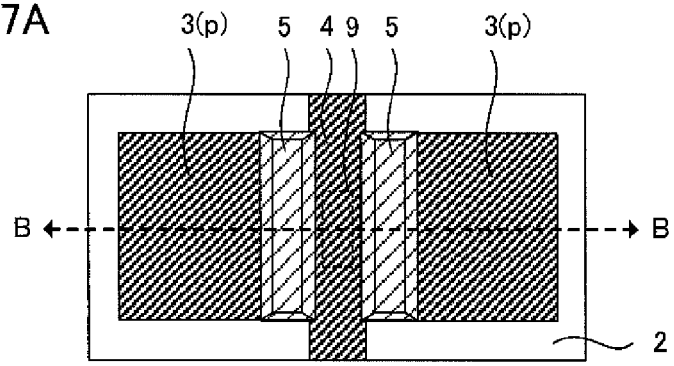
FIGS. 7A and 7B are schematic views showing an example of a formation aspect of a spacer portion in an embodiment of the present invention.
Figure 7B:
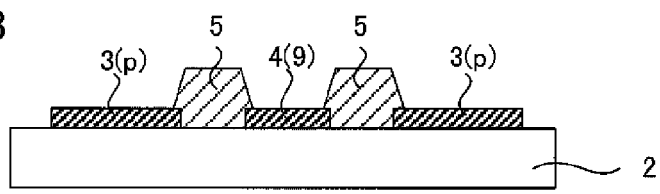

Here, the number of the spacer portions formed between the pixel electrode and the after-mentioned contact portion signifies the number of stripes formed between the pixel electrode and the contact portion when the spacer portion in stripes is formed in the lengthwise direction between the adjacent pixel electrode and contact portion. Accordingly, the number of the spacer portions 5 as exemplified in FIGS. 7A and 7B is 1. Incidentally, FIGS. 7A and 7B are schematic views showing an example of the spacer portion formed in this step. Also, FIG. 7A is a schematic plan view of the case where the spacer portion is formed between the pixel electrode and the auxiliary electrode, and FIG. 7B is a B-B line cross-sectional view of FIG. 7A. The reference numerals not explained in FIGS. 7A and 7B are the same as FIGS. 1A to 1F. Therefore, the description herein is omitted.

Figure 8A:
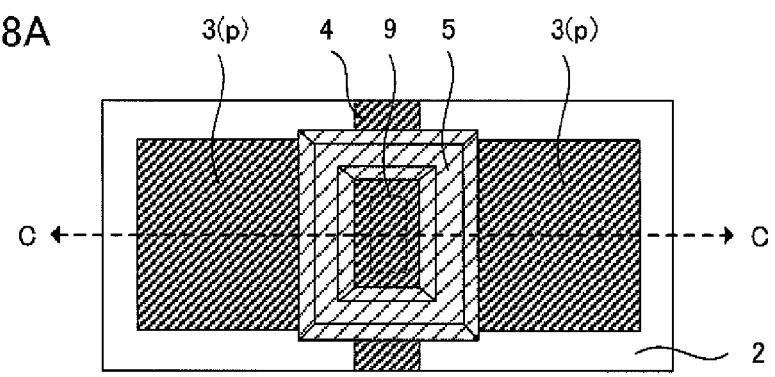
FIGS. 8A and 8B are schematic views showing another example of a formation aspect of a spacer portion in an embodiment of the present invention.
Figure 8B:
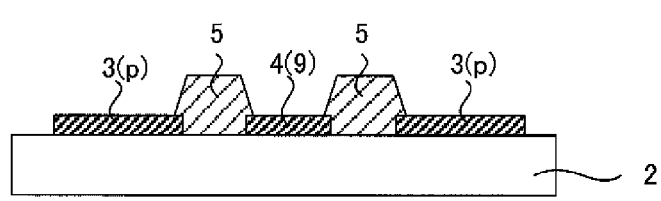
Figure 9A:
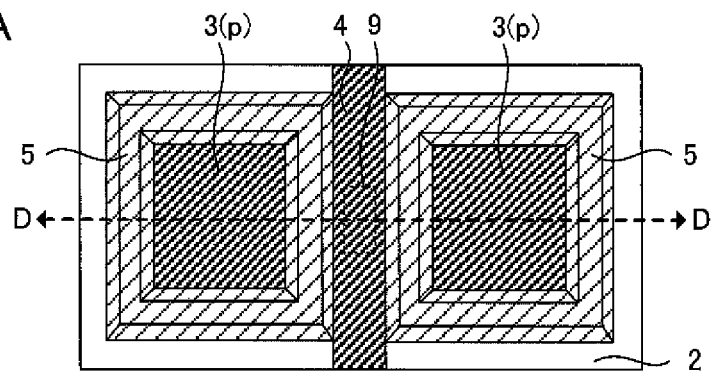
FIGS. 9A and 9B are schematic views showing another example of a formation aspect of a spacer portion in an embodiment of the present invention.
Figure 9B:
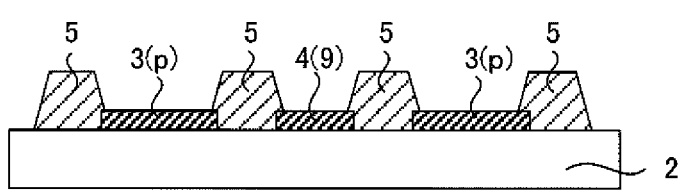

The planar shape of the spacer portion formed in this step is not particularly limited as long as the spacer portion is formed so as to separate the pixel electrode and the after-mentioned contact portion. However, as exemplified in FIG. 7A, the spacer portions 5 may be formed in stripes between the pixel electrode 3 and the contact portion 9 in the auxiliary electrode 4, as exemplified in FIG. 8A, the spacer portions 5 may be formed in frames so as to surround the contact portion 9 in the auxiliary electrode 4, or as exemplified in FIG. 9A, the spacer portions 5 may be formed in frames so as to surround the contact portion 9 in the auxiliary electrode 4 and the adjacent pixel electrode 3. Incidentally, FIGS. 8A and 8B and 9A and 9B are schematic views showing another example of the spacer portion formed in this step. Also, FIGS. 8A and 9A are schematic plan views of the case where the spacer portion is formed between the pixel area, on which the pixel electrode is formed, and the contact portion in the auxiliary electrode, FIG. 8B is a C-C line cross-sectional view of FIG. 8A, and FIG. 9B is a D-D line cross-sectional view of FIG. 9A. The reference numerals not explained in FIGS. 8A to 9B are the same as FIGS. 1A to 1F. Therefore, the description herein is omitted.

Also, the longitudinal cross-sectional shape of the spacer portion formed in this step is not particularly limited as long as the function described above of the spacer portion can be performed. Examples thereof include a forward tapered shape, an inverse tapered shape and a rectangular shape, above all, a forward tapered shape is preferable. The reason therefore is to allow the after-mentioned transparent electrode layer to be uniformly formed on the whole surface and allow sufficient continuity even though the spacer portion is formed so as to surround the pixel electrode or the auxiliary electrode as exemplified in FIGS. 8A and 9A.

The height of the spacer portion formed in this step is not particularly limited as long as the height is such as to allow the cover material to be arranged so as to contact with the top portion of the spacer portion by the intermediary of the organic layer when facing the organic EL layer-side substrate and the cover material in the after-mentioned arrangement step; however, specifically, the height is preferably within a range of 0.1 µm to 10 µm, more preferably within a range of 0.5 µm to 5 µm, particularly, within a range of 1 µm to 3 µm. The reason therefore is that the height of the spacer portion being within the range, the space between the organic EL layer-side substrate and the cover material, formed when facing the organic EL layer-side substrate and the cover material, can be made larger so as to allow the degree of vacuum of the space to be restrained from deteriorating abruptly even in the case where gas intrudes slightly into the space. Also, the problem can be prevented that when facing and contacting the organic EL layer-side substrate and the cover material in the after-mentioned arrangement step, the cover material warps to contact with the organic EL layer formed on the pixel electrode, and has a bad influence on display properties of the organic EL display device.

Incidentally, the height of the spacer portion signifies a height h from the lower base to the top portion H of the spacer portion 5 as shown in FIG. 5.

A material used for such a spacer portion is not particularly limited as long as the material is a material such as not to have a bad influence on the properties of the organic EL display device obtained by an embodiment of the present invention, but, for example, an insulating material is preferably used as the material for the spacer portion in the case where the spacer portion contacts with the pixel electrode. A malfunction due to leak current from an edge portion of the pixel electrode may be prevented. Specific examples of the material include photocurable resin such as photosensitive polyimide resin and acrylic resin, or thermosetting resin and inorganic materials.

In addition, the spacer portion formed in this step may comprise a pedestal portion and a adhering portion formed on the pedestal portion. Specifically, as exemplified in FIG. 10, the spacer portion may comprise a pedestal portion 11 formed on the substrate 2 and a adhering portion 12 formed on the pedestal portion 11.

The spacer portion comprises the pedestal portion and the adhering portion, so that the height of the spacer portion is easily adjusted. For example, in the case where any wiring layer is formed on the substrate and an insulating layer is formed on the wiring layer, the height of the insulating layer rises by an equivalent to the thickness of the wiring layer. In such a case, by making the insulating layer into the pedestal portion, and forming the adhering portion on the insulating layer as the pedestal portion to obtain the spacer portion, the height of the spacer portion comprising the insulating layer as the pedestal portion and the adhering portion formed on the insulating layer can be easily made higher than the height of the insulating layer formed on the wiring layer. Also, when facing the cover material to the organic EL layer-side substrate in the after-mentioned arrangement step, the spacer portion and the cover material can be selectively contacted. Thus, the function described above as the spacer portion can be sufficiently performed.

In the case where the spacer portion comprises the pedestal portion and the adhering portion, the size of the pedestal portion is properly adjusted in accordance with the size between the pixel area and the contact portion, or the size and the number of the adhering portion formed on the pedestal portion. The height of the pedestal portion is, for example, preferably within a range of 0.1 µm to 5 µm, more preferably within a range of 0.5 µm to 3 µm, particularly, within a range of 1 µm to 2 µm. The height of the pedestal portion being within the range allows the effect described above by forming the pedestal portion.

Incidentally, the height of the pedestal portion signifies a height $h_d$ from the lower base to the top portion of the pedestal portion 11 as shown in FIG. 10.

Also, the longitudinal cross-sectional shape of the pedestal portion is not particularly limited as long as the adhering portion can be formed on the pedestal portion. Examples thereof include a forward tapered shape, an inverse tapered shape and a rectangular shape. Above all, a forward tapered shape is preferable. The reason therefore is to allow the after-mentioned transparent electrode layer to be uniformly formed on the whole surface and allow sufficient continuity even though the pedestal portion and the adhering portion are formed so as to surround the pixel electrode or the auxiliary electrode.

In addition, a material used for the pedestal portion is the same as the material for the spacer portion described above. Therefore, the description herein is omitted.

On the other hand, a material used for the adhering portion may be the same as the material for the spacer portion described above. However, additionally, a conductive material may be used as the material for the adhering portion in the case where the pedestal portion is formed from an insulating material.

The size and the number of the adhering portion are the same as the size and the number of the spacer portion described above. Therefore, the description herein is omitted.

(b) Spacer Portion Forming Step

The spacer portion forming step in an embodiment of the present invention has a step of forming the spacer portion between the pixel area, on which the pixel electrode is formed, and the after-mentioned contact portion. A general method such as a lamination method, a photolithography method and a printing method may be used as a method for forming the spacer portion. Also, examples thereof include a method wherein the spacer portion is separately formed by using a mold, for example, and the spacer portion is adhered between the pixel area and the contact portion by using an adhesive.

Also, in the case where the spacer portion comprises the pedestal portion and the adhering portion, the spacer portion forming step in an embodiment of the present invention has a step of forming the pedestal portion between the pixel area, on which the pixel electrode is formed, and the after-mentioned contact portion, to thereafter, forming the adhering portion on the pedestal portion. A method for forming the pedestal portion and the adhering portion is the same as a method for forming the spacer portion described above. Therefore, the description herein is omitted. Incidentally, in the case where the pedestal portion and the adhering portion comprise the same material, the pedestal portion and the adhering portion may be formed all together.

(3) Organic EL Layer Forming Step

This step is a step of forming an organic EL layer comprising a plurality of organic layers and including at least a luminous layer on the pixel electrode. Also, in this step, at least one layer of the organic layers is formed on the whole surface of the auxiliary electrode in an organic EL layer-side substrate.

The organic EL layer formed in this step and the specific organic EL layer forming step are hereinafter described.

(a) Organic EL Layer

Examples of the organic layers composing the organic EL layer include a hole injecting layer, a hole transporting layer, an electron injecting layer and an electron transporting layer other than a luminous layer.

Each of the organic layers composing the organic EL layer is hereinafter described.

(i) Luminous Layer

The luminous layer formed in this step may be a monochromatic luminous layer or a multicolored luminous layer, and is properly selected in accordance with uses of the organic EL display device. In the case where the organic EL display device is a display device, a multicolored luminous layer is ordinarily formed.

A luminescent material used for the luminous layer may be a material emitting fluorescence or phosphorescence, and examples thereof include coloring materials, metal complex materials and polymeric materials. Incidentally, specific coloring materials, metal complex materials and polymeric materials are the same as materials to be generally used. Therefore, the description herein is omitted.

The thickness of the luminous layer is not particularly limited as long as the thickness is such as to allow the function of emitting light by providing the field for recombination of electrons and positive holes, but may be approximately 10 nm to 500 nm, for example.

(ii) Hole Injecting Transporting Layer

As the organic EL layer formed in this step, a hole injecting transporting layer may be formed between the luminous layer and an anode.

The hole injecting transporting layer may be a hole injecting layer including a hole injection function, a hole transporting layer including a hole transport function, a laminated layer of the hole injecting layer and the hole transporting layer, and a layer including both the hole injection function and the hole transport function.

A material used for the hole injecting transporting layer is not particularly limited as long as the material is such as to allow injection and transportation of positive holes into the luminous layer to be stabilized, but a general material may be used.

The thickness of the hole injecting transporting layer is not particularly limited as long as the thickness is such as to allow the hole injection function and the hole transport function to be sufficiently performed; specifically, the thickness is preferably within a range of 0.5 nm to 1000 nm, more preferably within a range of 10 nm to 500 nm.

(iii) Electron Injecting Transporting Layer

As the organic EL layer formed in this step, an electron injecting transporting layer may be formed between the luminous layer and a cathode.

The electron injecting transporting layer may be an electron injecting layer including an electron injection function, an electron transporting layer including an electron transport function, a laminated layer of the electron injecting layer and the electron transporting layer, and a layer including both the electron injection function and the electron transport function.

A material used for the electron injecting layer is not particularly limited as long as the material is such as to allow injection of electrons into the luminous layer to be stabilized, and a material used for the electron transporting layer is not particularly limited as long as the material is such as to allow electrons injected from the cathode to be transported into the luminous layer.

A general material may be used as a specific material used for the electron injecting layer and the electron transporting layer.

The thickness of the electron injecting transporting layer is not particularly limited as long as the thickness is such as to allow the electron injection function and the electron transport function to be sufficiently performed.

(b) Organic EL Layer Forming Step

The organic EL layer forming step in an embodiment of the present invention has a step of forming the organic EL layer described above on the pixel electrode. Incidentally, the case where the organic EL layers are laminated in order of the hole injecting transporting layer, the luminous layer and the electron injecting transporting layer is described herein.

A method for forming the hole injecting transporting layer is not particularly limited as long as it can be formed at least on the pixel electrode, but is properly selected in accordance with kinds of the material. Examples thereof include a wet process of applying a coating liquid for forming the hole injecting transporting layer in which the material is dissolved or dispersed in a solvent, and a dry process such as a vacuum deposition method.

Next, a method for forming the luminous layer is not particularly limited as long as it can be formed on the hole injecting transporting layer, but examples thereof include a wet process of applying a coating liquid for forming the luminous layer in which the luminescent material is dissolved or dispersed in a solvent, and a dry process such as a vacuum deposition method. Above all, a dry process is preferable in view of an influence on luminous efficiency and lifetime of the organic EL display device.

Next, a method for forming the electron injecting transporting layer is not particularly limited as long as it can be formed on the luminous layer, but is properly selected in accordance with kinds of the material. Examples thereof include a wet process of applying a coating liquid for forming the electron injecting transporting layer in which the material is dissolved or dispersed in a solvent, and a dry process such as a vacuum deposition method.

Also, in the organic EL layer forming step, the organic EL layer is formed and at least one layer of the organic layers composing the organic EL layer is formed so as to cover the auxiliary electrode. For example, in the case of assigning the luminous layer to each pixel of the organic EL display device, the hole injecting transporting layer and the electron injecting transporting layer are formed on the pixel electrode and the auxiliary electrode, and the luminous layer is formed on the pixel electrode in a pattern. Incidentally, in the case where the organic layer is formed on the pixel electrode and the auxiliary electrode, the organic layer is generally formed successively on the pixel electrode and the auxiliary electrode.

Incidentally, in an embodiment of the present invention, for example, the hole injecting transporting layer, the luminous layer and the electron transporting layer may be formed in this step, and thereafter the electron injecting layer may be formed after the after-mentioned arrangement step and contact portion forming step. The reason therefore is that the auxiliary electrode and the transparent electrode layer formed by the after-mentioned transparent electrode layer forming step can be electrically connected in the contact portion in the case where the thickness of the electron injecting layer is extremely thin, even though the electron injecting layer formed after the arrangement step and the contact portion forming step is formed on the pixel electrode as well as on the contact portion in the auxiliary electrode. In this manner, in the case of forming the electron injecting layer after the arrangement step and the contact portion forming step, the electron injecting layer can be prevented from deteriorating due to the arrangement step and the contact portion forming step, so that a material such as lithium fluoride, which is conceived to be comparatively unstable, can be used as the material for the electron injecting layer.

2. Arrangement Step

In an embodiment of the present invention, an arrangement step of arranging a cover material to face the organic EL layer-side substrate obtained in the organic EL layer-side substrate preparing step under a first pressure so that the cover material is in contact with the top portion of the spacer portion by the intermediary of the organic layers is performed.

The cover material used in this step and the specific arrangement step are hereinafter described.

(1) Cover Material

The cover material used in this step can be divided into three aspects of a first aspect in which the cover material is a resin film including a barrier property with an oxygen permeability of 100 cc/m²·day or less, a second aspect in which the cover material is a polyethylene terephthalate film and a third aspect in which the cover material is a glass film.

The cover material used in this step is hereinafter described while divided into each aspect.

(a) First Aspect

The oxygen permeability of the cover material of this aspect is 100 cc/m²·day or less, preferably 30 cc/m²·day or less, particularly, 15 cc/m²·day or less. The oxygen permeability of the cover material being within the range allows the cover material to have a desired barrier property, so that gas can be prevented from intruding from the space on the opposite side to the organic EL layer-side substrate, in relation to the cover material, into the space between the organic EL layer-side substrate and the cover material during the after-mentioned contact portion forming step. Thus, a decompressed state in the space between the organic EL layer-side substrate and the cover material can be retained, and in the contact portion forming step, adhesion properties between the organic EL layer-side substrate and the cover material can be maintained also when illuminating the organic layer on the auxiliary electrode with laser light through the cover material.

Incidentally, the oxygen permeability herein can be calculated by using the following formula (I).

$$GTR = V_C/(R \times T \times P_u \times A) \times d_p/d_t \quad (I)$$

GTR: gas permeability (mol/m²·Pa)
$V_C$: low-pressure side capacity (l)
T: test temperature
$P_u$: differential pressure of supply gas (Pa)
A: permeable area (m²)
$d_p/d_t$: pressure change on low-pressure side at unit time (s) (Pa)
R: 8.31×10³ (l·Pa/K·mol)

Also, the cover material of this aspect comprises a resin film. The cover material comprising a resin film, so as to allow the development into a roll-to-roll manufacturing technique and allow the improvement of production efficiency. Examples of a specific material include polyethylene (PE), polycarbonate (PC), polyethylene terephthalate (PET) and cyclopolyolefin (COP). Above all, polyethylene terephthalate is preferable. The resin film made of polyethylene terephthalate is so low in oxygen permeability as compared with a resin film composed of other materials so that gas can be prevented more effectively from intruding from the space on the opposite side to the organic EL layer-side substrate, in relation to the cover material, into the space between the organic EL layer-side substrate and the cover material during the after-mentioned contact portion forming step.

In addition, with regard to the cover material of this aspect, the minimum transmittance value in a wavelength range of 340 nm to 400 nm is preferably equal to or greater than 70%. Above all, the minimum transmittance value is preferably equal to or greater than 75%, particularly equal to or greater than 80%. The laser light can be restrained from being absorbed in the cover material when illuminating with the laser light through the cover material in the contact portion forming step for the reason that the minimum transmittance value of the cover material in a wavelength range of 340 nm to 400 nm is within the range. Thus, the contact portion can be formed by securely removing the organic layer, and the occurrence of brightness unevenness due to voltage drop can be restrained by sufficiently connecting the transparent electrode layer and the auxiliary electrode in the contact portion.

Incidentally, the minimum transmittance value of the cover material in a wavelength range of 340 nm to 400 nm can be measured by, for example, ultraviolet and visible spectrophotometer UV-3600 manufactured by Shimadzu Corporation.

The thickness of the cover material is not particularly limited as long as the thickness can achieve the oxygen permeability and transmittance value described above. The thickness is preferably, for example, within a range of 1 µm to 1000 µm, more preferably within a range of 10 µm to 200 µm, particularly, within a range of 30 µm to 100 µm.

Also, with regard to the cover material of this aspect, a barrier layer may be formed on the surface thereof. The cover material of this aspect including a barrier layer, gas can be prevented more effectively from intruding from the space on the opposite side to the organic EL layer-side substrate, in relation to the cover material, into the space between the organic EL layer-side substrate and the cover material in the after-mentioned contact portion forming step.

A material for the barrier layer in this aspect is not particularly limited as long as the barrier layer can perform a desired barrier property against gases such as oxygen and nitrogen and can transmit laser light used in the after-mentioned contact portion forming step, but examples thereof include inorganic materials. Specific examples of the inorganic materials include silicon oxide, silicon nitride, silicon carbide, titaniumoxide, niobiumoxide, indiumoxide, zinc oxide, tin oxide, tantalum oxide, aluminum oxide, magnesium oxide, calcium oxide and zirconium oxide. Also, a glass film may be used as the barrier layer. It is feared that a glass film cracks, however, being adhered to the resin film allows a glass film to be restrained from cracking, and a glass film can be conveyed even in the case of cracking.

The thickness of the barrier layer is not particularly limited as long as the thickness is such that the cover material can achieve the average transmittance value described above when forming the barrier layer on the cover material of this aspect, but the thickness is preferably, for example, within a range of 10 nm to 800 nm, more preferably within a range of 50 nm to 500 nm, particularly, within a range of 70 nm to 300 nm.

Examples of a method for forming the barrier layer on the surface of the cover material of this aspect include a sputtering method, a vacuum deposition method and a plasma CVD method. Also, the barrier layer may be formed singly and the barrier layer may be adhered on the surface of the cover material by using an adhesive layer composed of a cohesive material. Also, in the case of using a glass film as the barrier layer, a glass film may be adhered on the surface of the cover material by the intermediary of the adhesive layer. The cohesive material used for the adhesive layer is not particularly limited as long as the cohesive material can adhere the barrier layer on the surface of the cover material at a desired strength and can transmit laser light used in the after-mentioned contact portion forming step, but examples thereof include polycarbonate-based resin, polyolefin-based resin, acrylic-based resin, urethane-based resin, silicone-based resin, polyester-based resin and epoxy-based resin. In addition, the thickness of the adhesive layer is not particularly limited as long as the thickness is such as to allow the cover material and the barrier layer to be sufficiently adhered, but the thickness can be specifically determined within a range of 5 µm to 50 µm.

In the case where the cover material of this aspect has the barrier layer, the barrier layer may be disposed on one surface of the cover material, or on both surfaces of the cover material. Incidentally, in the case where the barrier layer is disposed on one surface of the cover material, the barrier layer in the cover material may be disposed on the side of the organic EL layer-side substrate or on the opposite side to the organic EL layer-side substrate when facing the cover material and the organic EL layer-side substrate.

Also, a combination of the cover material and the barrier layer in the case where the cover material of this aspect has the barrier layer is not particularly limited as long as the combination can perform a desired barrier property, but the combination is preferably, for example, a combination such that the barrier layer is formed on the surface of the cover material made of COP, a combination such that the barrier layer is formed on the surface of the cover material made of PP, and a combination such that the barrier layer is formed on the surface of the cover material made of PC. Above all, a combination such that the barrier layer is formed on the surface of the cover material made of COP is preferable. The reason therefore is that the cover material made of COP is high in transmittance value of the laser light as compared with the cover material composed of other materials so as to be capable of sufficiently illuminating with the laser light through the cover material in the contact portion forming step even in the case where the barrier layer is formed on the surface of the cover material.

(b) Second Aspect

The cover material of this aspect is a polyethylene terephthalate film. The cover material being a polyethylene terephthalate film allows the development into a roll-to-roll manufacturing technique and allows the improvement of production efficiency.

The thickness of such a cover material of this aspect is not particularly limited as long as the thickness is within a range of 15 µm to 200 µm, but is preferably, within a range of 30 µm to 150 µm, particularly, within a range of 70 µm to 130 µm. The thickness of the cover material of this aspect being equal to or greater than 15 µm, a desired barrier property can be performed against gas even in the case where the barrier layer, for example, is not separately formed on the surface of the cover material. Thus, in the after-mentioned contact portion forming step, the effect such that gas can be prevented from intruding from the outer peripheral of the organic EL layer-side substrate and the cover material into the space between the organic EL layer-side substrate and the cover material, is obtained. Also, the thickness of the cover material of this aspect being 200 µm or less, the effect such the development into a roll-to-roll manufacturing technique of the cover material is made appropriate and the production efficiency is improved, is obtained.

Incidentally, the above-mentioned desired barrier property is not particularly limited as long as the barrier property is such as to allow the effect, but the oxygen permeability is preferably, for example, 100 $cc/m^2 \cdot day$ or less, more preferably 30 $cc/m^2 \cdot day$ or less, particularly, 15 $cc/m^2 \cdot day$ or less.

Also, the barrier layer may be formed on one surface or on both surfaces of the cover material. The cover material of this aspect has the barrier layer, so that gas can be prevented more effectively from intruding from the outer peripheral of the organic EL layer-side substrate and the cover material into the space between the organic EL layer-side substrate and the cover material in the after-mentioned contact portion forming step. Incidentally, the material, thickness and forming method of the barrier layer are the same as the contents described in the item of "(a) First aspect". Therefore, the description herein is omitted.

(c) Third Aspect

The cover material of this aspect is a glass film. The glass film is a glass substrate having flexibility. Incidentally, flexibility signifies the capability of winding up into a roll. Specifically, flexibility signifies bending at application of a force of 5 KN in a bending test method of fine ceramics of JIS R1601.

A material used for the glass film is not particularly limited as long as the material can be formed into a film, but examples thereof include soda lime glass and alkalifree glass. Above all, colorless alkalifree glass with high degree of transparency is appropriate. The reason therefore is that the laser light can be restrained from being absorbed in the cover material when illuminating with the laser light through the cover material in the contact portion forming step.

The thickness of the glass film may be a thickness such as to satisfy flexibility and is, for example, preferably within a range of 5 μm to 300 μm.

Incidentally, the glass film is generally high in barrier property and satisfies the barrier property of the resin film of the first aspect.

A resin layer may be formed on one surface or on both surfaces of the glass film. The glass film can be restrained from cracking. A resin substrate may be used as the resin layer. Examples of a material used for the resin substrate include polyethylene naphthalate (PEN), polyethylene terephthalate (PET), polyether sulfone (PES), polyimide (PI), polyether ether ketone (PEEK), polycarbonate (PC), polyethylene (PE), polypropylene (PP), polyphenylene sulfide (PPS), polyether imide (PEI), cellulose triacetate (CTA), cyclopolyolefin (COP), polymethyl methacrylate (PMMA), polysulfone (PSF), polyamide imide (PAI), norbornene-based resin and allyl ester resin.

The thickness of the resin substrate is not particularly limited as long as the thickness allows the cover material to have flexibility, but is, for example, preferably within a range of 3 μm to 200 μm, more preferably within a range of 5 μm to 200 μm.

The resin substrate may be adhered to the glass film by the intermediary of an adhesive layer. Incidentally, the adhesive layer may be the same as the adhesive layer described in the first aspect.

(2) Arrangement Step

This step is a step of arranging the cover material described above to face the organic EL layer-side substrate under a first pressure so that the cover material is in contact with the top portion of the spacer portion by the intermediary of the organic layer. At this moment, a space between the organic EL layer-side substrate and the cover material is made into a decompressed state. Specific examples of a method for performing such a step include the following method. That is to say, examples thereof include a method wherein, at first, the organic EL layer-side substrate with a sealing material formed on periphery thereof and the cover material are arranged to face to each other in a vacuum chamber set at a predetermined degree of vacuum which is the first pressure, and then, the organic EL layer-side substrate and the cover material are brought into contact, and a method wherein the organic EL layer-side substrate and the cover material are brought into contact by using a jig in a vacuum chamber set at the first pressure.

In the case of using a jig, the jig may be such as to allow the organic EL layer-side substrate and the cover material to be in contact. For example, a jig may fix by pinching the organic EL layer-side substrate and the cover material, or a jig may fix by pinching only the cover material in such a manner that the cover material does not bend.

Also, the jig is preferably such as to allow a space on the opposite side to the organic EL layer-side substrate, in relation to the cover material, to be sealed hermetically. Specific examples thereof include a frame-like jig. The reason therefore is that, for example, by arranging a frame-like jig on both faces of the cover material and pushing the cover material against a laser light transmission window of the vacuum chamber by the intermediary of the frame-like jig arranged on the face of the cover material on the opposite side to the organic EL layer-side substrate, the space on the opposite side to the organic EL layer-side substrate, in relation to the cover material, can be sealed hermetically and pressure in the space on the opposite side to the organic EL layer-side substrate, in relation to the cover material, can be adjusted in the after-mentioned adhering step. In this case, the organic EL layer-side substrate may be mounted, for example, on a stage movable upward and downward, and by moving the stage upward to bring contact the organic EL layer-side substrate into contact with the cover material fixed by the frame-like jig, the space between the organic EL layer-side substrate and the cover material can be made into a decompressed state. An O ring may be used as the frame-like jig arranged on the face of the cover material on the opposite side to the organic EL layer-side substrate.

The space between the organic EL layer-side substrate and the cover material is made into a predetermined degree of vacuum which is the first pressure. Specifically, the predetermined degree of vacuum is not particularly limited as long as the organic EL layer-side substrate and the cover material can be sufficiently adhered, and dust of the organic layer removed by laser light can be prevented from being scattered on the pixel area in the after-mentioned contact portion forming step by adjusting the pressure in the space on the opposite side to the organic EL layer-side substrate, in relation to the cover material, to a second pressure in the after-mentioned adhering step, so as to cause differential pressure between the space between the organic EL layer-side substrate and the cover material and the space on the opposite side to the organic EL layer-side substrate, in relation to the cover material. However, the value of the degree of vacuum is preferably as large as possible, namely, the value of the pressure in the space between the organic EL layer-side substrate and the cover material is preferably as small as possible. Above all, in this step, the space between the organic EL layer-side substrate and the cover material is preferably a vacuum space. A specific degree of vacuum is preferably within a range of $1\times10^{-5}$ Pa to $1\times10^{4}$ Pa, more preferably within a range of $1\times10^{-5}$ Pa to $1\times10^{3}$ Pa, particularly, within a range of $1\times10^{-5}$ Pa to $1\times10^{2}$ Pa.

3. Adhering Step

In an embodiment of the present invention, a adhering step of adhering the organic EL layer-side substrate and the cover material by adjusting a space on the opposite side to the organic EL layer-side substrate, in relation to the cover material, to a second pressure which is higher than the first pressure is performed.

The specific adhering step is hereinafter described.

This step is a step of adhering the organic EL layer-side substrate and the cover material by adjusting the space on the opposite side to the organic EL layer-side substrate, in relation to the cover material, to the second pressure which is higher than the first pressure to thereby cause differential pressure between the space between the organic EL layer-side substrate and the cover material and the space on the opposite side to the organic EL layer-side substrate, in relation to the cover material.

When adjusting the space on the opposite side to the organic EL layer-side substrate, in relation to the cover material, to the second pressure, at least the space on the opposite side to the organic EL layer-side substrate, in relation to the cover material, can be adjusted to the second pressure. For example, only the space on the opposite side to the organic EL layer-side substrate, in relation to the cover material, may be adjusted to the second pressure, or the outer peripheral space of the cover material and the organic EL layer-side substrate may be adjusted to the second pressure.

A method for adjusting the space on the opposite side to the organic EL layer-side substrate, in relation to the cover material, to the second pressure is not particularly limited as long as the method is such as to cause differential pressure between the space between the organic EL layer-side substrate and the cover material and the space on the opposite side to the organic EL layer-side substrate, in relation to the cover material, and allow the organic EL layer-side substrate and the cover material to be adhered. However, examples thereof include the following method. That is to say, examples thereof include a method wherein the outer peripheral space of the organic EL layer-side substrate and the cover material is returned to normal pressure by exposing the organic EL layer-side substrate and the cover material brought into contact in the vacuum chamber, to a normal-pressure space, and a method wherein, after making the space between the organic EL layer-side substrate and the cover material into a decompressed state in the vacuum chamber, the space is pressurized by flowing gas into the vacuum chamber. Incidentally, the "normal-pressure space" in the case of performing the adhering step by the method wherein the contacted organic EL layer-side substrate and cover material are exposed to a normal-pressure space is preferably a space, for example, filled with inert gas such as nitrogen and argon, in which oxygen concentration and moisture concentration are at least 1 ppm or less, from the viewpoint of restraining the organic EL display device from deteriorating. Also, in the case of pressurizing by flowing gas into the vacuum chamber, gas may be flown into the whole vacuum chamber, or gas may be flown into only the space on the opposite side to the organic EL layer-side substrate, in relation to the cover material. As described above, in the case of using the frame-like jig, for example, the space on the opposite side to the organic EL layer-side substrate, in relation to the cover material, can be hermetically sealed to allow the organic EL layer-side substrate and the cover material to be adhered by flowing gas into this space. The gas flown into the vacuum chamber is preferably inert gas such as nitrogen and argon for the same reason as the above.

The "second pressure" is not particularly limited as long as the pressure is a pressure higher than the first pressure in the arrangement step and a pressure such as to allow the organic EL layer-side substrate and the cover material to be adhered by differential pressure between the first pressure and the second pressure, but, for example, the second pressure is higher than the first pressure preferably by equal to or greater than 100 Pa, more preferably by equal to or greater than 1000 Pa, particularly, by equal to or greater than 10000 Pa. The organic EL layer-side substrate and the cover material can be sufficiently adhered for the reason that differential pressure between the first pressure and the second pressure is the numerical value described above or more.

4. Contact Portion Forming Step

In an embodiment of the present invention, a contact portion forming step of forming the contact portion by removing the organic layer covering the auxiliary electrode by illuminating with laser light through the cover material is performed.

The contact portion formed in this step and the specific contact portion forming step are hereinafter described.

(1) Contact Portion

The contact portion formed in this step is an area in which the auxiliary electrode and the after-mentioned transparent electrode layer contact.

The planar shape of the contact portion formed in this step is not particularly limited as long as the planar shape is such as to allow the after-mentioned transparent electrode layer and the auxiliary electrode to be electrically connected sufficiently, but examples thereof include a rectangular shape and a circular shape.

Figure 11A:
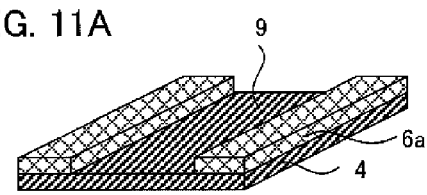
FIGS. 11A to 11C are schematic views explaining a contact portion in an embodiment of the present invention.
Figure 11B:
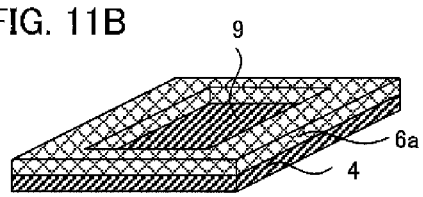
Figure 11C:
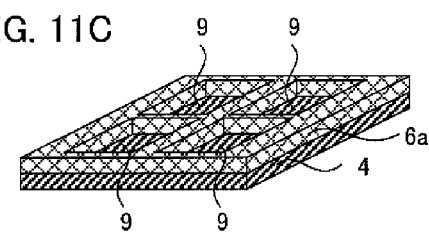
Figure 12A:
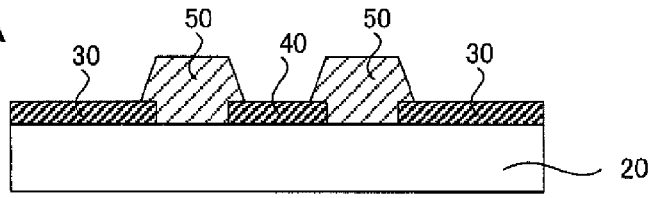
FIGS. 12A to 12E are process drawings showing an example of a conventional method for producing a top-emission organic EL display device.
Figure 12B:
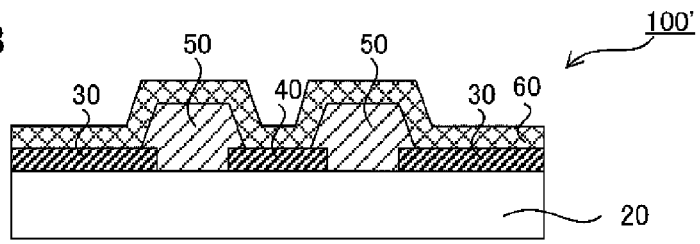
Figure 12C:
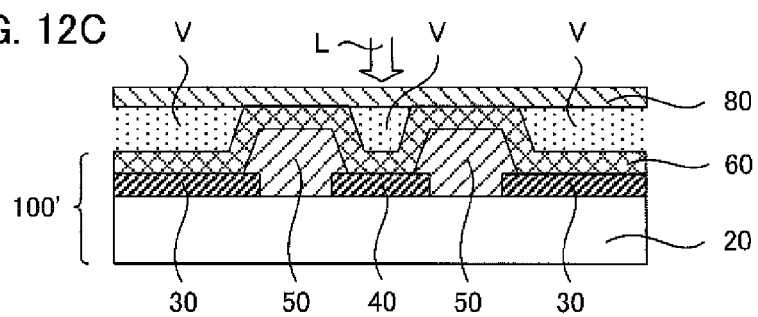
Figure 12D:
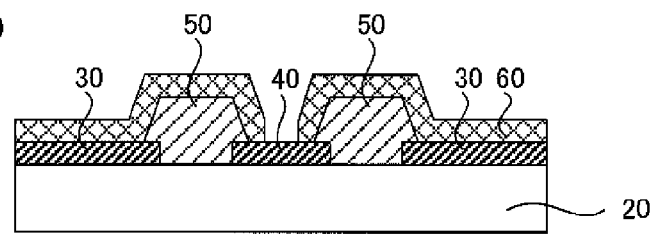
Figure 12E:
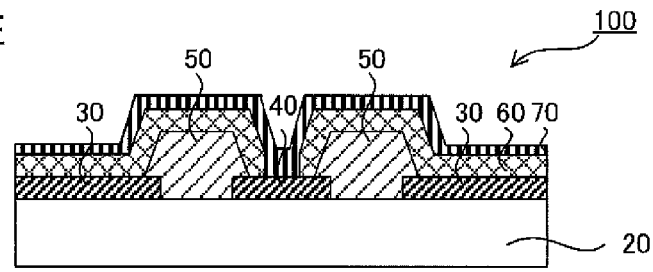

Also, the aspect of the contact portion is not particularly limited as long as it allows the after-mentioned transparent electrode layer and the auxiliary electrode to be electrically connected sufficiently. FIGS. 11A to 11C are schematic views explaining the aspect of the contact portion formed in this step. The specific aspect of the contact portion 9 may be an aspect such as to be formed by removing at least one layer of the organic layers 6a formed on the auxiliary electrode 4 in stripes as shown in FIG. 11A, an aspect such as to be formed by making an opening in at least one layer of the organic layers 6a formed on the auxiliary electrode 4 as shown in FIG. 11B, and an aspect such as to be formed by making a plurality of openings in at least one layer of the organic layers 6a formed on the auxiliary electrode 4 as shown in FIG. 11C.

(2) Contact Portion Forming Step

The contact portion forming step in an embodiment of the present invention has a step of forming the contact portion described above by removing the organic layers covering the auxiliary electrode by illuminating with laser light through the cover material. Incidentally, in the case of using the method wherein pressure is adjusted by flowing gas into the vacuum chamber as the adhering step described above, this step may be performed by the following method. That is to say, the method is such that the contact portion is formed by removing the organic layers covering the auxiliary electrode by illuminating with laser light through a laser light transmission window placed in the vacuum chamber comprising a translucent substrate such as glass.

The laser light used in this step is not particularly limited as long as it can remove the organic layers covering the auxiliary electrode transmitting through the cover material when illuminating through the cover material, but laser light used generally in a removal method by laser light of the organic layers may be adopted. A wavelength range of the laser light is not particularly limited as long as the wavelength range is such as to transmit through the cover material used in an embodiment of the present invention to efficiently remove the organic layer, but, for example, an ultraviolet range is preferable. A specific ultraviolet range is preferably within a range of 300 nm to 400 nm, more preferably within a range of 320 nm to 380 nm, particularly, within a range of 340 nm to 360 nm. Examples of the laser light with such a wavelength range include solid-state laser such as YAG and $YVO_4$, excimer laser such as XeCl and XeF, and semiconductor laser.

Also, the laser light may be pulsed laser or continuous-wave laser, above all, preferably pulsed laser. The pulsed laser has a high peak-to-peak value allowing the organic layers covering the auxiliary electrode to be efficiently removed. On the other hand, since the pulsed laser has high output, the organic layers removed by the pulsed laser are easily scattered to bring a possibility of contaminating the pixel area extensively. In contrast, an embodiment of the present invention is useful in the case of using the pulsed laser since the organic layer can be prevented from being scattered.

In the case of the pulsed laser, a pulse width is preferably within a range of 0.01 nanosecond to 100 nanosecond. Also, a repetition frequency is preferably within a range of 1 kHz to 1000 kHz. The output may be properly adjusted so as to allow the organic layer to be removed.

5. Transparent Electrode Layer Forming Step

In an embodiment of the present invention, a transparent electrode layer forming step of forming a transparent electrode layer on the organic EL layer and on the contact portion so as to be electrically connected to the auxiliary electrode in the contact portion, is performed.

The transparent electrode layer formed in this step and the specific transparent electrode layer forming step are hereinafter described.

(1) Transparent Electrode Layer

The transparent electrode layer in this step is formed on the organic EL layer-side substrate.

The transparent electrode layer may be such as to have transparency and electrical conductivity, and examples thereof include metallic oxides. Specific examples of the metallic oxides include indium tin oxide, indium oxide, indium zinc oxide, zinc oxide and stannic oxide. Also, metallic materials such as magnesium-silver alloy, aluminum and calcium may be used in the case of forming a film so thinly as to have light transmittance.

(2) Transparent Electrode Layer Forming Step

The transparent electrode layer forming step in an embodiment of the present invention has a step of forming the transparent electrode layer on the organic EL layer and the contact portion so as to be electrically connected to the auxiliary electrode in the contact portion while peeling off the cover material adhered to the organic EL layer-side substrate in the adhering step. A general method for forming an electrode may be used as a method for forming the transparent electrode layer, and examples thereof include PVD methods or CVD methods such as a vacuum deposition method, a sputtering method, an EB evaporation method and an ion plating method.

6. Other Steps

An embodiment of the present invention is not particularly limited as long as it has the steps described above but may have other steps. Examples of the other steps include a sealing step of sealing an organic EL display device by a sealing substrate.

The sealing substrate is hereinafter described.

The organic EL display device in an embodiment of the present invention is of a top-emission type, so that the sealing substrate has light transmittance. The light transmittance of the sealing substrate may have transmittance for wavelength of a visible light range. Specifically, the light transmittance value for all wavelengths of a visible light range is preferably equal to or greater than 80%, more preferably equal to or greater than 85%, particularly, equal to or greater than 90%.

Here, the light transmittance value may be measured, for example, by ultraviolet and visible spectrophotometer UV-3600 manufactured by Shimadzu Corporation.

Also, the sealing substrate may have flexibility or not, which is properly selected in accordance with uses of the organic EL display device.

A material for the sealing substrate is not particularly limited as long as the material is such as to allow the sealing substrate having light transmittance, but examples thereof include inorganic materials such as quartz and glass, and resins such as acrylic resin, cycloolefin polymer referred to as COP, polycarbonate, polyethylene terephthalate, polybutylene terphthalate, polyphenylene sulfide, polyimide, polyamide imide, polyether sulfone, polyether imide and polyether ether ketone. Also, a gas barrier layer may be formed on the surface of the sealing substrate made of resin.

The thickness of the sealing substrate is properly selected in accordance with materials for the sealing substrate and uses of the organic EL display device. Specifically, the thickness of the sealing substrate is approximately 0.001 mm to 5 mm.

7. Organic EL Display Device

The organic EL display device obtained by a producing method of an embodiment of the present invention may be such as to take light out from at least the transparent electrode layer side, it may be of a top-emission type in which light is taken out from the transparent electrode layer side, or may be of a double-face emitting type in which light is taken out from both the transparent electrode layer side and the pixel electrode side.

B. Cover Material for Forming Organic EL Display Device

A cover material for forming an organic EL display device of an embodiment of the present invention is used in the above-described method for producing for an organic EL display device, wherein the cover material is a resin film including a barrier property with an oxygen permeability of 100 cc/m$^2$·day or less, and the minimum transmittance value in the wavelength range of 340 nm to 400 nm is equal to or greater than 70%.

The use of the cover material for forming an organic EL display device of an embodiment of the present invention allows the organic EL display device to be produced by the method described in the item of "A. Method for producing organic EL display device", and allows to obtain the organic EL display device in which deterioration in display properties can be restrained.

The cover material for forming an organic EL display device is the same as described in the item of "A. Method for producing organic EL display device 2. Arrangement step (1) Cover material (a) First aspect"; therefore, the description herein is omitted.

Incidentally, an embodiment of the present invention is not limited to the above-described aspects. The aspects are exemplification, and thus, any is included in the technical scope of an embodiment of the present invention if it has substantially the same constitution and exhibiting the same functions and effects as the technical idea described in the claim of an embodiment of the present invention.

EXAMPLES

An embodiment of the present invention is hereinafter described specifically while using examples.

Example 1

A simulation was performed for a change with time in a difference between pressure in the space between the organic EL layer-side substrate and the cover material and pressure in the outer peripheral space of the organic EL layer-side substrate and the cover material, that is, differential pressure between both spaces when facing the cover material to the surface of the organic EL layer-side substrate under a first pressure to make the space between the organic EL layer-side substrate and the cover material into a decompressed state, and thereafter, adjusting the outer peripheral space of the organic EL layer-side substrate and the cover material to a second pressure. Incidentally, the conditions of the cover material are as shown in the following Table 1.

TABLE 1

| No. | Oxygen Permeability (cc/m² · day) | Nitrogen Permeability (cc/m² · day) | Remarks |
|---|---|---|---|
| 1 | 0.3 | 0.1 | Examples |
| 2 | 15 | 5 | |
| 3 | 30 | 10 | |
| 4 | 100 | 33 | |
| 5 | 300 | 100 | Comparative |
| 6 | 600 | 200 | Examples |
| 7 | 1500 | 500 | |
| 8 | 3000 | 1000 | |

Incidentally, nitrogen permeability is ordinarily conceived to be approximately ⅓ of oxygen permeability. Accordingly, the nitrogen permeability shown in Table 1 was calculated as ⅓ of the oxygen permeability. Also, the oxygen permeability was evaluated by using MOCON oxygen permeability measuring device OX-TRAN 2/21 manufactured by Hitachi High-Technologies Corporation.

(Evaluations)

Evaluations were performed for a change with time in a difference between pressure in the space between the organic EL layer-side substrate and the cover material and pressure in the outer peripheral space of the organic EL layer-side substrate and the cover material, that is, differential pressure between both spaces when facing the cover material to the surface of the organic EL layer-side substrate under a first pressure to make the space between the organic EL layer-side substrate and the cover material into a decompressed state, and thereafter, adjusting the outer peripheral space of the organic EL layer-side substrate and the cover material to a second pressure. Incidentally, the differential pressure herein is calculated by the following formulae (1) and (2).

$$GTR = V_C/(R \times T \times P_{u \times A}) \times d_p/d_t \quad (1)$$

(In the formula (1), GTR: gas permeability (mol/m²·Pa), $V_C$: low-pressure side capacity (l), T: test temperature, $P_u$: differential pressure of supply gas (Pa), A: permeable area (m²), $d_p/d_t$: pressure change on low-pressure side at unit time (s) (Pa), R: 8.31×10³ (l·Pa/K·mol))

Differential pressure=(pressure in the outer peripheral space of the organic EL layer–side substrate and the cover material)−(pressure in the space between the organic EL layer–side substrate and the cover material) (2)

The evaluation results are shown in Table 2.

TABLE 2

| | | Kind of Cover Material | | | | | | | |
|---|---|---|---|---|---|---|---|---|---|
| | | No. 1 | | No. 2 | | No. 3 | | No. 4 | |
| | | Differential Pressure (Pa) | Change Rate (%) | Differential Pressure (Pa) | Change Rate (%) | Differential Pressure (Pa) | Change Rate (%) | Differential Pressure (Pa) | Change Rate (%) |
| Change With Time | 1 Minute Later | 99995 | 100 | 99769 | 100 | 99537 | 100 | 98472 | 98 |
| | 2 Minutes Later | 99991 | 100 | 99538 | 100 | 99076 | 99 | 96968 | 97 |
| | 5 Minutes Later | 99977 | 100 | 98848 | 99 | 97707 | 98 | 92591 | 93 |
| | 10 Minutes Later | 99954 | 100 | 97709 | 98 | 95466 | 95 | 85731 | 86 |
| | 1 Hour Later | 99723 | 100 | 87018 | 87 | 75698 | 76 | 39703 | 40 |

| | | Kind of Cover Material | | | | | | | |
|---|---|---|---|---|---|---|---|---|---|
| | | No. 5 | | No. 6 | | No. 7 | | No. 8 | |
| | | Differential Pressure (Pa) | Change Rate (%) | Differential Pressure (Pa) | Change Rate (%) | Differential Pressure (Pa) | Change Rate (%) | Differential Pressure (Pa) | Change Rate (%) |
| Change With Time | 1 Minute Later | 95370 | 95 | 90741 | 91 | 76852 | 77 | 53704 | 54 |
| | 2 Minutes Later | 90955 | 91 | 82339 | 82 | 59062 | 59 | 28841 | 29 |
| | 5 Minutes Later | 78898 | 79 | 61519 | 62 | 26803 | 27 | 4467 | 4 |
| | 10 Minutes Later | 62249 | 62 | 37846 | 38 | 7187 | 7 | 200 | 0 |
| | 1 Hour Later | 5818 | 6 | 294 | 0 | 0 | 0 | 0 | 0 |

As shown in the results of Table 2, the differential pressure lowering rate in 10 minutes after making the space between the cover material and the organic EL layer-side substrate into a decompressed state was 15% or less in Nos. 1 to 4, and adhesion properties between the cover material and the organic EL layer-side substrate could be maintained. In contrast, the differential pressure lowering rate in 10 minutes after making the space between the cover material and the organic EL layer-side substrate into a decompressed state was 38%, 62%, 93% and 100% respectively in Nos. 5 to 8, it was difficult to maintain adhesion properties between the cover material and the organic EL layer-side substrate. Through the above, it was found that the use of the cover material of an embodiment of the present invention, whose gas permeability is in a predetermined range, allowed the decompressed state of the space between the cover material and the organic EL layer-side substrate to be maintained and allowed adhesion properties between the cover material and the organic EL layer-side substrate to be prevented from lowering with time.

Example 2

(Pixel Electrode and Auxiliary Electrode Forming Step)

A chromium film with a film thickness of 150 nm was formed by a sputtering method on a substrate made of alkalifree glass with a film thickness of 0.7 mm. Thereafter, a pixel electrode and an auxiliary electrode were concurrently formed by a photolithography method.

(Spacer Portion Forming Step)

Next, a spacer portion was formed in between the pixel electrode and an area for forming a contact portion in the auxiliary electrode by a photolithography method. Incidentally, the planar shape of the spacer portion was a frame-like shape and the longitudinal cross-sectional shape thereof was a forward tapered shape. Also, the height of the spacer portion was 1.5 µm.

(Organic EL Layer Forming Step)

Next, a hole injecting layer of 0.1 µm was formed on the pixel electrode, and subsequently a luminous layer of 0.3 µm was formed on the hole injecting layer. Thereafter, an electron transporting layer of 0.3 µm was formed on the luminous layer and regarded as an organic EL layer. Incidentally, the organic EL layer was formed on the pixel electrode as well as on the auxiliary electrode.

(Sealing Material Forming Step)

A sealing material was formed on the outer periphery of the pattern of the organic EL layer-side substrate by using a dispenser.

(Arrangement Step and Adhering Step)

Next, in a vacuum chamber set at a degree of vacuum of 50 Pa, a cover material was faced to the organic EL layer-side substrate to contact the cover material with the surface of the organic EL layer-side substrate and a space between the organic EL layer-side substrate and the cover material was made into a decompressed state. Thereafter, nitrogen gas was flown into the vacuum chamber, so that the inside of the chamber was returned to normal pressure to adhere the organic EL layer-side substrate and the cover material. The cover material used in these steps satisfies the conditions shown in Table 3.

Incidentally, oxygen permeability and nitrogen permeability in Table 3 were calculated by the same method as Example 1.

Also, the minimum transmittance shown in Table 3 was a measured value in a wavelength range of 340 nm to 400 nm and was measured by using ultraviolet and visible spectrophotometer UV-3600 manufactured by Shimadzu Corporation.

In addition, in Nos. 16 to 18 in Table 3, a cover material with a barrier layer made of $SiO_2$ of film thickness of 0.2 µm formed on the surface thereof was used.

(Contact Portion Forming Step)

Next, YAG laser light with an energy of 500 mJ/cm$^2$, a spot diameter of 10 µmϕ, a wavelength of 355 nm and a pulse width of 5 nsec was illuminated by one shot through the cover material to remove the hole injecting layer, the luminous layer and the electron transporting layer covering the auxiliary electrode and to form a contact portion by exposing the auxiliary electrode.

(Electron Injecting Layer and Transparent Electrode Layer Forming Step)

Thereafter, peeling off the cover material, lithium fluoride was formed into a film with thickness of 0.5 nm by a vacuum deposition method so as to be electrically connected to the auxiliary electrode exposed in the contact portion to form an electron injecting layer. Subsequently, calcium was formed into film with thickness of 10 nm and aluminum was formed into film with thicknesses of 5 nm by a vacuum deposition method to form a transparent electrode layer.

(Sealing Step)

An organic EL display device produced as described above was adhered and sealed by adhering a sealing substrate with an adhesive applied thereon.

(Evaluations)

The space between the cover material and the organic EL layer-side substrate was made into a decompressed state by using the cover material of Nos. 9 to 18 shown in Table 3 to adhere the organic EL layer-side substrate and the cover material. After a predetermined time, the organic layer formed on the auxiliary electrode was removed by laser light through the cover material, and the presence or absence of the scattering of the organic layer onto the surface of the organic EL layer in a pixel area at this time was observed. Incidentally, a case was evaluated as "A" when the scattering of the organic layer onto the surface of the organic EL layer in a pixel area was prevented in the illumination of the laser light after elapsed time of 1 hour or more from the occurrence of the decompressed state, and a case was evaluated as "B" when the scattering of the organic layer onto the surface of the organic EL layer in a pixel area was

TABLE 3

| No. | Material | Thickness (µm) | Oxygen Permeability (cc/m$^2$ · day) | Nitroge Permeability (cc/m$^2$ · day) | Minimum Transmittance Value (%) | Barrier Layer | Remarks |
|---|---|---|---|---|---|---|---|
| 9 | COP | 100 | >200 | >200 | 90 | Not | Comparative |
| 10 | PE | 50 | >200 | >200 | 90 | Formed | Examples |
| 11 | PC | 50 | >200 | >200 | 84 | | |
| 12 | PET | 15 | 100 | 33 | 86 | | Examples |
| 13 | PET | 50 | 27.8 | 9.3 | 86 | | |
| 14 | PET | 100 | 12.9 | 4.3 | 84 | | |
| 15 | PET | 200 | 6 | 2 | 84 | | |
| 16 | COP | 50 | 4.3 | 1.4 | 85 | Fromed | |
| 17 | COP | 100 | 0.07 | 0.02 | 84 | | |
| 18 | PET | 100 | <0.01 | <0.01 | 82 | | | prevented in illumination of the laser light after elapsed time of 10 minutes or less from the occurrence of the decompressed state, and additionally, a case was evaluated as "0" when the scattering of the organic layer onto the surface of the organic EL layer in a pixel area was not prevented in the illumination of the laser light after elapsed time of 10 minutes or less from the occurrence of the decompressed state.

The evaluation results are shown in Table 4.

TABLE 4

| No. | Evaluation Result | Remarks |
|-----|-------------------|---------|
| 9   | C                 | Comparative |
| 10  | C                 | Examples |
| 11  | C                 |         |
| 12  | B                 | Examples |
| 13  | A                 |         |
| 14  | A                 |         |
| 15  | A                 |         |
| 16  | A                 |         |
| 17  | A                 |         |
| 18  | A                 |         |

In the case of using the cover material of Nos. 9 to 11 of which both oxygen permeability and nitrogen permeability are 200 cc/m²·day or more, the removed organic layer was scattered on the pixel area even though the elapsed time from the occurrence of the decompressed state to the illumination of the laser light was 10 minutes or less. Through the above, it was found that oxygen permeability and nitrogen permeability of a predetermined range or more made it difficult to maintain the decompressed state of the space between the organic EL layer-side substrate and the cover material, and did not allow the organic EL layer-side substrate and the cover material to be sufficiently adhered.

In contrast, in the case of using the cover material of No. 12 whose oxygen permeability is 100 cc/m²·day and nitrogen permeability is 33 cc/m²·day, by removing the organic layer on the auxiliary electrode by illuminating with laser light within 10 minutes after the occurrence of the decompressed state, the removed organic layer was prevented from being scattered on the pixel area. Also, in the case of using the cover material of Nos. 13 to 18 whose oxygen permeability is 27.8 cc/m²·day or less and nitrogen permeability is 9.3 cc/m²·day or less, the removed organic layer was prevented from being scattered on the pixel area even though the organic layer on the auxiliary electrode was removed by illuminating with laser light after elapsed time of 1 hour or more from the occurrence of the decompressed state. Through the above, it was found that oxygen permeability and nitrogen permeability of a predetermined range or less allowed the decompressed state of the space between the organic EL layer-side substrate and the cover material to be maintained, and allowed the organic EL layer-side substrate and the cover material to be sufficiently adhered.

Example 3

An organic EL display device was produced in the same manner as Example 2 except for performing the organic EL layer forming step in the following manner.

(Organic EL Layer Forming Step)

Next, a hole injecting layer and a hole transporting layer were formed on the pixel electrode so as to be 0.1 μm, and subsequently a luminous layer of 0.02 μm was formed on the hole transporting layer. Thereafter, an electron transporting layer of 0.03 μm was formed on the luminous layer and regarded as an organic EL layer. Incidentally, the organic EL layer was formed on the pixel electrode as well as on the auxiliary electrode.

(Evaluations)

The same results as Example 2 were obtained.

REFERENCE SIGNS LIST 1 organic EL layer-side substrate
2 substrate
3 pixel electrode
4 auxiliary electrode
5 spacer portion
6 organic EL layer
7 transparent electrode layer
8 cover material
9 contact portion
10 top-emission organic EL display device
11 pedestal portion
12 adhering portion

What is claimed is:

1. A method for producing a top-emission organic electroluminescence display device, the top-emission organic electroluminescence display device comprising: a substrate, a plurality of pixel electrodes formed on the substrate, an auxiliary electrode formed between the pixel electrodes adjacent to each other, a spacer portion formed on the substrate, an organic electroluminescence layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic electroluminescence layer and the contact portion, the spacer portion being formed between the contact portion and the pixel electrode adjacent to the contact portion, and the transparent electrode layer being electrically connected to the auxiliary electrode in the contact portion; and the method for producing a top-emission organic electroluminescence display device comprising steps of:

an organic electroluminescence layer-side substrate preparing step of preparing an organic electroluminescence layer-side substrate comprising the substrate, the pixel electrodes, the auxiliary electrode, the spacer portion, and the organic electroluminescence layer, at least one layer of the organic layers being formed on the whole surface of the auxiliary electrode, an arrangement step of arranging a cover material to face the organic electroluminescence layer-side substrate obtained in the organic electroluminescence layer-side substrate preparing step under a first pressure so that the cover material is in contact with a top portion of the spacer portion by the intermediary of the organic layer, an adhering step of adhering the organic electroluminescence layer-side substrate and the cover material by adjusting a space on the opposite side to the organic electroluminescence layer-side substrate, in relation to the cover material, to a second pressure which is higher than the first pressure, and a contact portion forming step of forming the contact portion by removing the organic layer formed on the auxiliary electrode by illuminating with laser light through the cover material;

wherein the cover material is a resin film including a barrier property with an oxygen permeability of 100 cc/m2·day or less, and the cover material is supplied in a roll-to-roll manner.

2. The method for producing a top-emission organic electroluminescence display device according to claim 1, wherein a minimum transmittance value of the cover material in a wavelength range of 340 nm to 400 nm is equal to or greater than 70%.

3. A method for producing a top-emission organic electroluminescence display device, the top-emission organic electroluminescence display device comprising a substrate, a plurality of pixel electrodes formed on the substrate, an auxiliary electrode formed between the pixel electrodes adjacent to each other, a spacer portion formed on the substrate, an organic electroluminescence layer formed on the pixel electrodes, comprising a plurality of organic layers, and including at least a luminous layer, at least one layer of the organic layers formed on the auxiliary electrode, a contact portion as an opening of the organic layer, formed on the auxiliary electrode, and a transparent electrode layer formed on the organic electroluminescence layer and the contact portion, the spacer portion being formed between the contact portion and the pixel electrode adjacent to the contact portion, and the transparent electrode layer being electrically connected to the auxiliary electrode in the contact portion; and the method for producing a top-emission organic electroluminescence display device comprising steps of:

an organic electroluminescence layer-side substrate preparing step of preparing an organic electroluminescence layer-side substrate comprising the substrate, the pixel electrodes, the auxiliary electrode, the spacer portion, and the organic electroluminescence layer, at least one layer of the organic layers being formed on the whole surface of the auxiliary electrode, an arrangement step of arranging a cover material to face the organic electroluminescence layer-side substrate obtained in the organic electroluminescence layer-side substrate preparing step under a first pressure so that the cover material is in contact with a top portion of the spacer portion by the intermediary of the organic layer, an adhering step of adhering the organic electroluminescence layer-side substrate and the cover material by adjusting a space on the opposite side to the organic electroluminescence layer-side substrate, in relation to the cover material, to a second pressure which is higher than the first pressure, and a contact portion forming step of forming the contact portion by removing the organic layer formed on the auxiliary electrode by illuminating with laser light through the cover material;

wherein the cover material is a polyethylene terephthalate film, and the cover material is supplied in a roll-to-roll manner.

4. The method for producing a top-emission organic electroluminescence display device according to claim 1, wherein the cover material has a barrier property with an oxygen permeability of 30 cc/m2·day or less.

5. The method for producing a top-emission organic electroluminescence display device according to claim 3, wherein the cover material has a barrier property with an oxygen permeability of 30 cc/m2·day or less.

6. The method for producing a top-emission organic electroluminescence display device according to claim 1, wherein the cover material has a barrier layer.

7. The method for producing a top-emission organic electroluminescence display device according to claim 3, wherein the cover material has a barrier layer.

* * * * *